(12) United States Patent
Chapman

(10) Patent No.: US 9,237,084 B2
(45) Date of Patent: Jan. 12, 2016

(54) APPARATUS, SYSTEM, AND METHOD FOR PROVIDING ENERGY MANAGEMENT, PROFILES, AND MESSAGE BLOCKS IN A CABLE SERVICE ENVIRONMENT

(71) Applicant: CISCO TECHNOLOGY, INC., San Jose, CA (US)

(72) Inventor: John T. Chapman, Laguna Niguel, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 147 days.

(21) Appl. No.: 14/076,045

(22) Filed: Nov. 8, 2013

(65) Prior Publication Data

US 2014/0133330 A1 May 15, 2014

Related U.S. Application Data

(60) Provisional application No. 61/724,688, filed on Nov. 9, 2012, provisional application No. 61/729,186, filed on Nov. 21, 2012, provisional application No. 61/769,244, filed on Feb. 26, 2013.

(51) Int. Cl.
| | |
|---|---|
| H04L 1/00 | (2006.01) |
| H04L 12/26 | (2006.01) |
| H04L 12/24 | (2006.01) |
| H04L 12/851 | (2013.01) |
| H04L 29/08 | (2006.01) |

(52) U.S. Cl.
CPC ............ *H04L 43/50* (2013.01); *H04L 41/0806* (2013.01); *H04L 41/0816* (2013.01); *H04L 47/2483* (2013.01); *H04L 69/323* (2013.01); *H04L 41/0893* (2013.01)

(58) Field of Classification Search
CPC ... H04L 5/0007; H04L 5/0008; H04L 5/0009; H04L 1/0003; H04L 1/0004; H04L 1/0005; H04L 1/0006; H04W 24/00; H04W 24/01; H04W 24/02; H04W 24/03; H04W 24/04
USPC ........................................ 370/203–210, 252
See application file for complete search history.

(56) References Cited

U.S. PATENT DOCUMENTS

| | | | |
|---|---|---|---|
| 2005/0122996 A1 | 6/2005 | Azenkot et al. | |
| 2014/0022926 A1* | 1/2014 | Ling et al. | 370/252 |
| 2014/0079102 A1* | 3/2014 | Kliger et al. | 375/222 |
| 2014/0133352 A1 | 5/2014 | Chapman | |
| 2014/0133497 A1 | 5/2014 | Chapman | |

OTHER PUBLICATIONS

USPTO Jun. 5, 2015 Non-Final Office Action from U.S. Appl. No. 14/076,085.
USPTO Jun. 18, 2015 Non-Final Office Action from U.S. Appl. No. 14/076,015.

\* cited by examiner

*Primary Examiner* — Dady Chery
(74) *Attorney, Agent, or Firm* — Patent Capital Group

(57) ABSTRACT

A method is provided in one example and includes creating a plurality of profiles that describe one or more downstream modulations for each data-subcarrier in a channel to be used by a plurality of cable modems; receiving at least one testing measurement from the plurality of cable modems; and assigning a selected one of the plurality of profiles to each of the plurality of cable modems based, at least in part, on the one testing measurement that was received.

20 Claims, 27 Drawing Sheets

| TOTAL CMTS PROFILES | MINIMUM PROFILES PER LATENCY TARGET | MAXIMUM LATENCY (us) BASED UPON OFDM CHANNEL BANDWIDTH (MHz) | | | |
|---|---|---|---|---|---|
| | | 24 | 48 | 96 | 192 |
| 4 | 1 | 600 | 400 | 200 | 200 |
| 4 | 3 | 800 | 400 | 200 | 200 |
| 8 | 2 | 800 | 400 | 200 | 200 |
| 8 | 6 | 2400 | 1600 | 800 | 400 |
| 16 | 4 | 1600 | 1200 | 800 | 400 |
| 16 | 12 | 3200 | 2400 | 1600 | 800 |

| PHY LINK CHANNEL (PLC) | | |
|---|---|---|
| ELEMENT | PURPOSE | DETAIL |
| PREAMBLE | SYNC FIELD | • FOR CM TO INITIALLY FIND THE PLC CHANNEL |
| TS | TIMESTAMP | • ENHANCED FOR D3.1 |
| EM | ENERGY MANAGEMENT MESSAGE | • CONTAINS A SLEEP TIMER FOR A GROUP OF CMs |
| MC | MESSAGE CHANNEL | • CONTAINS MESSAGING FOR CM INITIALIZATION |

| NCP CHANNEL | | |
|---|---|---|
| ELEMENT | PURPOSE | DETAIL |
| NCP | NEXT CODEWORD POINTER | • POINTS TO START OF CODEWORD<br>• CONTAINS PROFILE IDENTIFICATION<br>• CW HEADER CONTAINS START OF PDU POINTER |

| PROFILES | RESULT |
|---|---|
| 2 | • MULTICAST CAN BE PLACED ON PROFILE A AS IT IS THE ONLY COMMON PROFILE<br>• ALTERNATIVELY, MULTICAST WOULD BE PLACED ON A COMMON HIGHER PROFILE |
| 3 | • MULTICAST CAN BE PLACED ON A COMMON PROFILE THAT IS NOT A (e.g., B)<br>• CMs COULD BE ON A-B, A-B-C OR A-B-D. UNICAST ON B, C, OR D<br>• CM ONLY ON PROFILE A IS A CORNER CASE |
| 4 | • MULTICAST COULD BE PLACED ON ANY PROFILE (ASSUMING 4 MAXIMUM PROFILES)<br>• MULTICAST SESSIONS MAY BE MOVED AS CMs JOIN/LEAVE<br>• USE DSID AND SEQUENCE NUMBERS TO PREVENT DUPLICATE PACKETS<br>• MULTICAST WOULD BE AS EFFICIENT AS UNICAST |

330 — MULTICAST TRAFFIC

FIG. 33

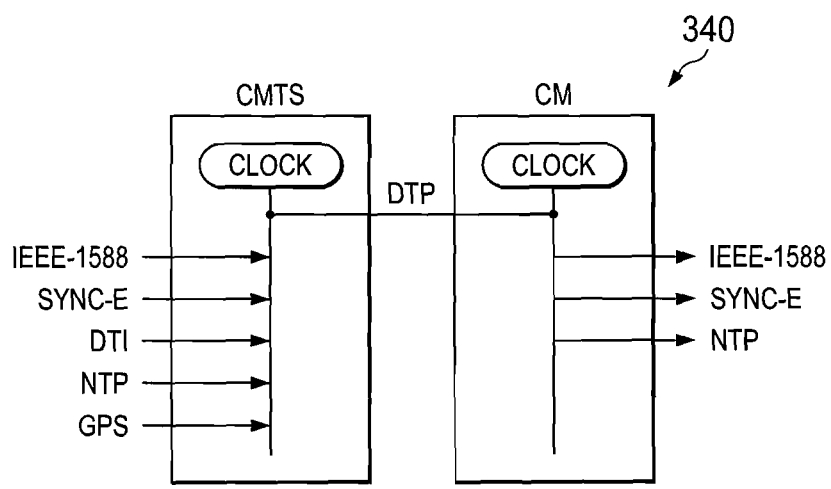

FIG. 34

APPARATUS, SYSTEM, AND METHOD FOR PROVIDING ENERGY MANAGEMENT, PROFILES, AND MESSAGE BLOCKS IN A CABLE SERVICE ENVIRONMENT

CROSS-REFERENCE TO RELATED APPLICATION

This application claims the benefit of priority under 35 U.S.C. §119(e) to U.S. Provisional Application Ser. Nos. 61/724,688, "MULTI-CHANNEL DOWNSTREAM ARCHITECTURE" filed on Nov. 9, 2012, 61/729,186, "MULTI-CHANNEL DOWNSTREAM ARCHITECTURE" filed on Nov. 21, 2012, and 61/769,244 "MULTI-CHANNEL DOWNSTREAM ARCHITECTURE" filed on Feb. 26, 2013, all of which are hereby incorporated by reference in their entirety.

TECHNICAL FIELD

This disclosure relates in general to the field of communications and, more particularly, to an apparatus, a system, and a method for providing energy management, profiles, and message blocks in a cable service environment.

BACKGROUND

Data Over Cable Service Interface Specification (DOCSIS) is an international telecommunications standard that permits the addition of high-speed data transfer to an existing cable TV (CATV) system. DOCSIS can be employed by cable television operators to provide Internet access over their existing hybrid fiber-coaxial (HFC) infrastructure. DOCSIS can provide a variety in options available at Open Systems Interconnection (OSI) layers 1 and 2, the physical, and data link layers. As with any system that serves consumers, optimizing speed, latency, processing time, synchronization, etc. presents a significant challenge to system designers, network architects, and engineers alike.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 19-20 illustrate example configurations and packet formatting associated with an example PHY Link Channel (PLC) in accordance with one embodiment of the present disclosure;

FIG. 33 is a table illustrating potential results and profiles associated with multicast traffic in accordance with one embodiment of the present disclosure; and FIG. 34 is a simplified block diagram illustrating one potential timing configuration associated with a cable modem termination system and a cable modem in accordance with one embodiment of the present disclosure.

DETAILED DESCRIPTION OF EXAMPLE EMBODIMENTS

Overview

Figure 1:
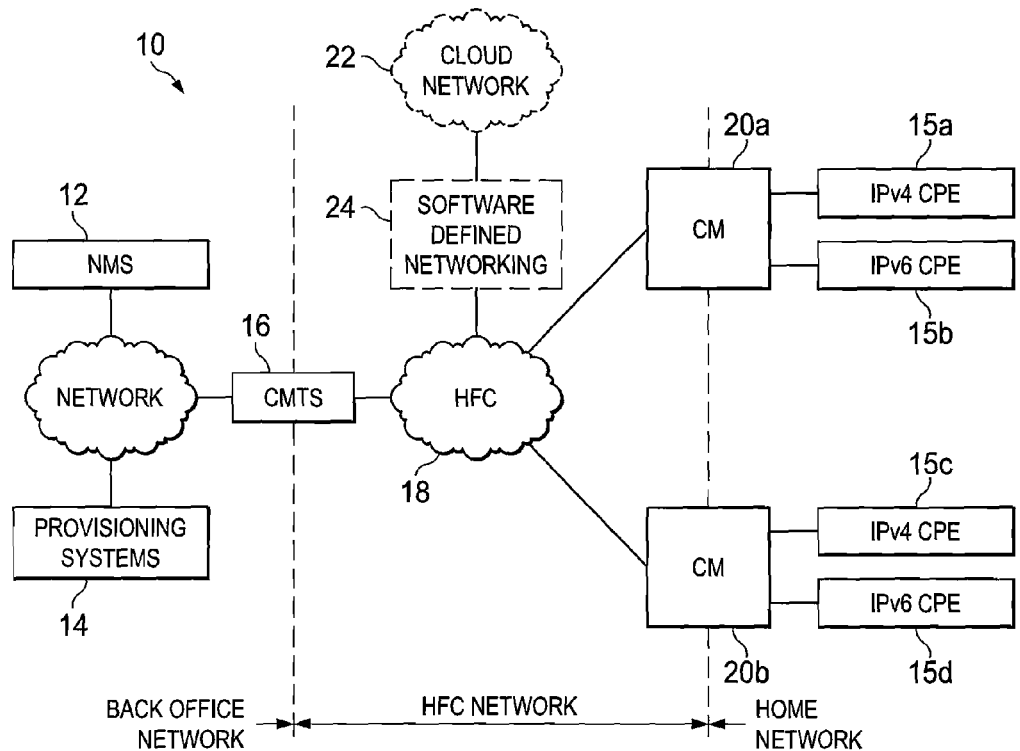
FIG. 1 is a simplified block diagram of a communication system associated with a hybrid fiber-coaxial (HFC) infrastructure in accordance with one embodiment of the present disclosure.

A method is provided in one example and includes creating a plurality of profiles that describe one or more downstream modulations for each data-subcarrier in a channel to be used by a plurality of cable modems; receiving at least one testing measurement from the plurality of cable modems; and assigning a selected one of the plurality of profiles to each of the plurality of cable modems based, at least in part, on the one testing measurement that was received.

In more particular embodiments, the method can include executing an algorithm in order to sort the plurality of cable modems into a set of groups based on signal-to-noise ratio measurements received from each of the plurality of cable modems. Additionally, the plurality of profiles are managed by a cable modem termination system (CMTS). The method could also include adjusting at least a portion of an orthogonal frequency-division multiplexing (OFDM) spectrum in a downstream path between the CMTS and the plurality of cable modems. Packets to be propagated to the plurality of cable modems can be placed into Forward Error Correction (FEC) codewords that have an associated one of the profiles. In certain cases, a CMTS is configured to assign a particular PHY Link Channel (PLC) to each OFDM channel in a downstream path between the CMTS and the plurality of cable modems.

Each of the plurality of cable modems can belong to multiple groups such that multiple transmission paths exist for each of the plurality of cable modems. Each of the profiles can include a list of modulation orders that are defined for one or more subcarriers within an OFDM channel. A CMTS can define the plurality of profiles for use in an OFDM channel for a downstream path between the CMTS and the plurality of cable modems. Each OFDM channel in a downstream path between the CMTS and the plurality of cable modems has its own unique set of profiles. Parameters that describe an OFDM downstream channel and each profile on that OFDM downstream channel can be defined in OFDM Channel Descriptor (OCD) and Downstream Profile Descriptor (DPD) messages.

A number of profiles supported by a CMTS is based, at least in part, on a latency characteristic and an available bandwidth for a particular OFDM channel. At least one of the profiles is a common profile used by a majority of the plurality of the cable modems that can receive and decode data. At least one of the profiles is used for communicating multicast MAC Management Message (MMMs). A DPD can be used by a CMTS to communicate parameters of the profiles to the plurality of cable modems. Multicast sessions can be propagated on a particular profile that is common to a multicast group associated with particular cable modems. A CMTS can indicate to a particular one of the plurality of cable modems to test a particular profile. Results of the test for the particular one of the cable modems is subsequently reported back to the CMTS such that the CMTS adds the particular profile to the particular one of the plurality of cable modems.

Example Embodiments

Turning to FIG. 1, FIG. 1 is a simplified block diagram of a communication system 10 associated with a hybrid fiber-coaxial (HFC) infrastructure in accordance with one embodiment of the present disclosure. In one example embodiment, the framework of FIG. 1 can leverage orthogonal frequency-division multiplexing (OFDM) to customize a frequency profile to allow for optimum throughput. Such a profile could, for example, use an optimal modulation order for each subcarrier and, further, mute subcarriers in situations where interference was present. In addition, Low Density Parity Check (LDPC) is an error correction technology that effectively allows higher orders of modulation to be used by the framework of FIG. 1. In one general sense, this could allow for an "average" signal-to-noise ratio (SNR) to be used for setting modulation levels. Note that despite the higher degree of flexibility that OFDM provides, the HFC plant is relatively stable and readily maintained, where the amount of variation among cable modems (CMs) can be minimized. Thus, a small number of profiles, such as four for example, may be sufficient to allow a compromise between system optimization and retaining a desired simplicity for the architecture, as further detailed below.

In at least one embodiment, the architecture of FIG. 1 can utilize downstream profiles to adjust the OFDM spectrum for appropriate transmission performance in the downstream path between a cable modem termination system (CMTS) and a CM. The CMTS can execute an algorithm to sort CMs into a small set of groups based on SNR measurements received from the CMs. The profile management, algorithms, and implementation can be executed on the CMTS, or a server, or at any other appropriate location in the network. A given CM may belong to multiple groups and, therefore, there can be multiple transmission paths to each CM. In one example embodiment, a given CMTS can tell the CM to test a particular profile. The CM can subsequently report back to the CMTS if the test passes. If the result of the test is positive, then the CMTS can add that profile to the CM. Hence, in at least one sense, there is a distributed system that can be used to test, validate, and add particular profiles.

Additionally, in certain embodiments of the present disclosure, CMs that are receiving or sending traffic below a configurable threshold can be put into a low power mode (e.g., a DOCSIS Light Sleep Mode (DLS)). This can be achieved by segmenting the CMs into logical DLS groups. Instructions can be provided to each of the CMs in each group (or individually) to shut down their receivers for a configurable period of time. Once that time has lapsed, the CM can re-enable its PHY, rejoin the network, and look for a message to indicate whether it should receive data or return to a power down mode.

Separately, the framework of FIG. 1 can provide for the generation of message blocks. The downstream direction can use a separate channel for sending signaling messages to the CMs when they are booting up and before they connect to the network. The channel can also provide basic features such as bootstrap parameters, timestamp, DLS messages, etc. In at least one sense, a message block can be viewed as a building block concept. A Next Codeword Pointer (NCP) can be constructed using message blocks, as further detailed below. There is also an update mechanism for the NCP that can use the profiles. Before detailing each of these functions (e.g., the message block, the energy/sleep mode capabilities, the downstream profile management, etc.), a brief overview of communication system 10 of FIG. 1 is provided, along with some general contextual information associated with the potential problems and technologies being implicated by the present disclosure.

Returning to FIG. 1, FIG. 1 includes a network management system (NMS) 12, a plurality of provisioning systems 14, and a CMTS 16, all of which may be suitably coupled to any type of network (e.g., an Internet, an Intranet, a wireless network, local area network (LAN), etc.). Also provided in FIG. 1 is an HFC network 18, which is coupled to multiple CMs 20a-20b. Each CM can be coupled to various instances of customer premise equipment (CPE) 15a-15d, which may be associated with Internet Protocol (IP) version 4 (IPv4) or version 6 (IPv6). FIG. 1 also includes at least one layer associated with a software defined networking (SDN) element 14, which may or may not cooperate with a cloud network 22 in accordance with certain embodiments of the present disclosure.

In one example implementation, the CM can connect to the operator's cable network and to a home network, bridging packets between them. Many CPE devices can connect to the CM's LAN interfaces. CPE devices can be embedded with the CM in a single device, or they can be separate, standalone devices. CPE devices may use IPv4, IPv6, or both forms of IP addressing. Examples of typical CPE devices include home routers, set-top devices, personal computers, etc. The CMTS connects the operator's back office and core network with the cable network. Its main function is to forward packets between these two domains, and between upstream and downstream channels on the cable network.

Various applications can be used in the back office to provide configuration and other support to the devices on the DOCSIS™ network. These applications can use IPv4 and/or IPv6, as appropriate to the particular operator's deployment. The applications can include provisioning systems such as:

1) The Dynamic Host Configuration Protocol (DHCP) servers provide the CM with initial configuration information, including IP address(es), when the CM boots.

2) The Config File server is used to download configuration files to CMs when they boot. Configuration files are in binary format and permit the configuration of the CM's parameters.

3) The Software Download server is used to download software upgrades to the CM.

4) The Time Protocol server provides Time Protocol clients, typically CMs, with the current time of day.

5) Certificate Revocation server provides certificate status.

With respect to the NMS, a Simple Network Management Protocol (SNMP) Manager allows the operator to configure and monitor SNMP agents (typically, the CM and the CMTS). A Syslog server collects messages pertaining to the operation of devices.

Figure 2:
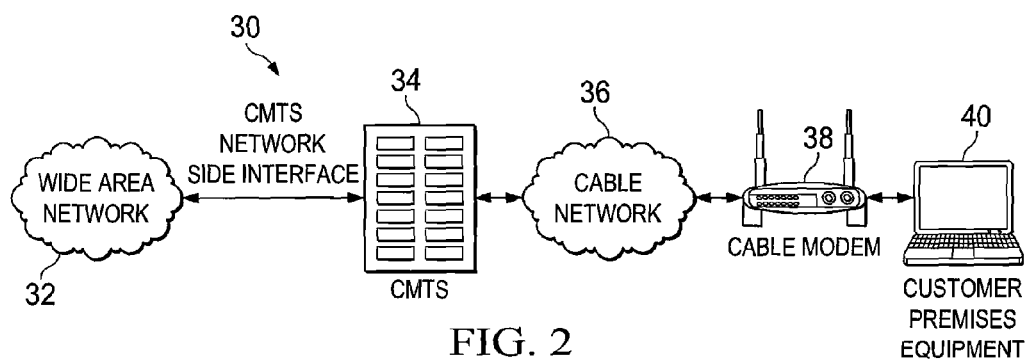
FIG. 2 is a simplified block diagram of a communication system associated with traffic propagating through a data-over-cable system in accordance with one embodiment of the present disclosure.

FIG. 2 is a simplified block diagram of an example communication system 30 associated with traffic propagating through the data-over-cable system in accordance with one embodiment of the present disclosure. FIG. 2 includes a wide area network (WAN) 32, a CMTS 34, a cable network 36, a cable modem 38, and a CPE 40. The DOCSIS system allows transparent bi-directional transfer of IP traffic, between the cable system head-end and customer locations, over an all-coaxial or hybrid-fiber/coax (HFC) cable network.

Figure 3:
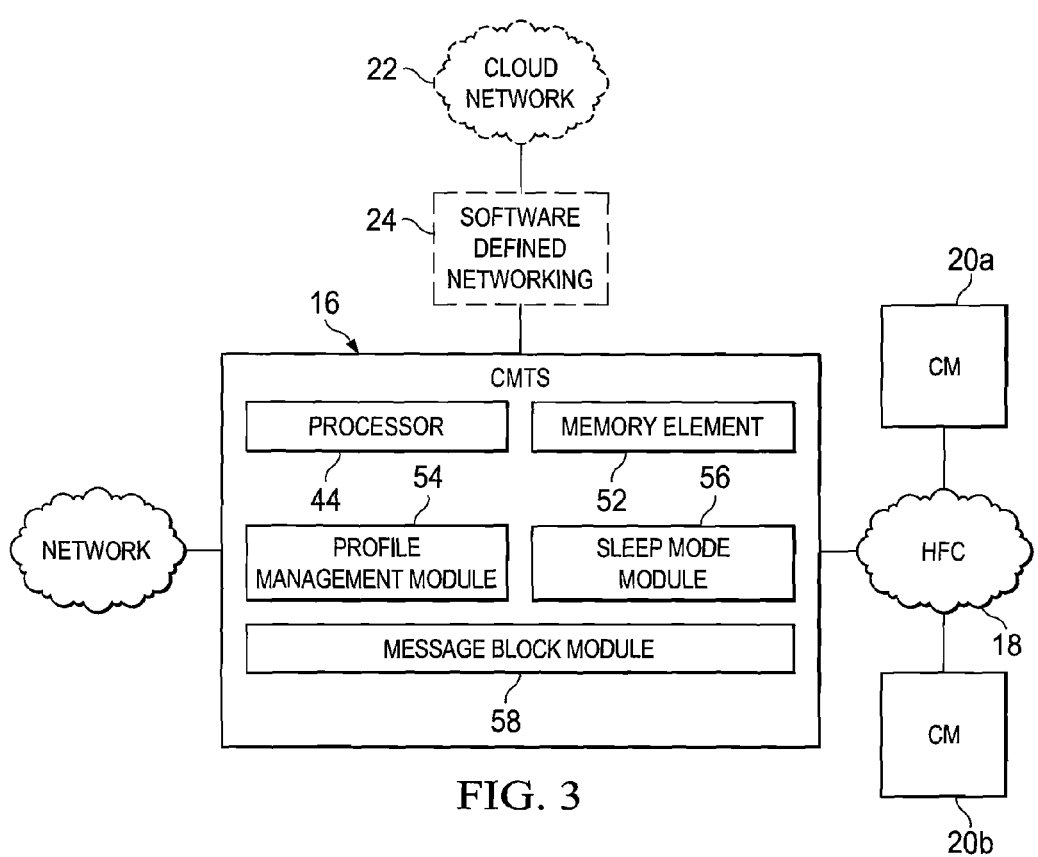
FIG. 3 is a simplified block diagram illustrating a plurality of modules to be used in the communication system in accordance with one embodiment of the present disclosure.

FIG. 3 is a simplified block diagram illustrating one possible configuration for achieving at least some of the functions discussed herein with respect to the sleep mode capabilities, the profile management, the message block construction, etc. FIG. 3 includes CMTS 16, which (in this particular non-limiting example) includes a processor 44, a memory element 52, a profile management module 54, a sleep mode module 56, and a message block module 58. Any of these functions and modules may be provided elsewhere (e.g., in a server, in a cloud component, in another device, etc.), or they can be consolidated in any suitable fashion, or responsibilities can be shared by any one or more of the CMs, along with CMTS 16.

Figure 4:
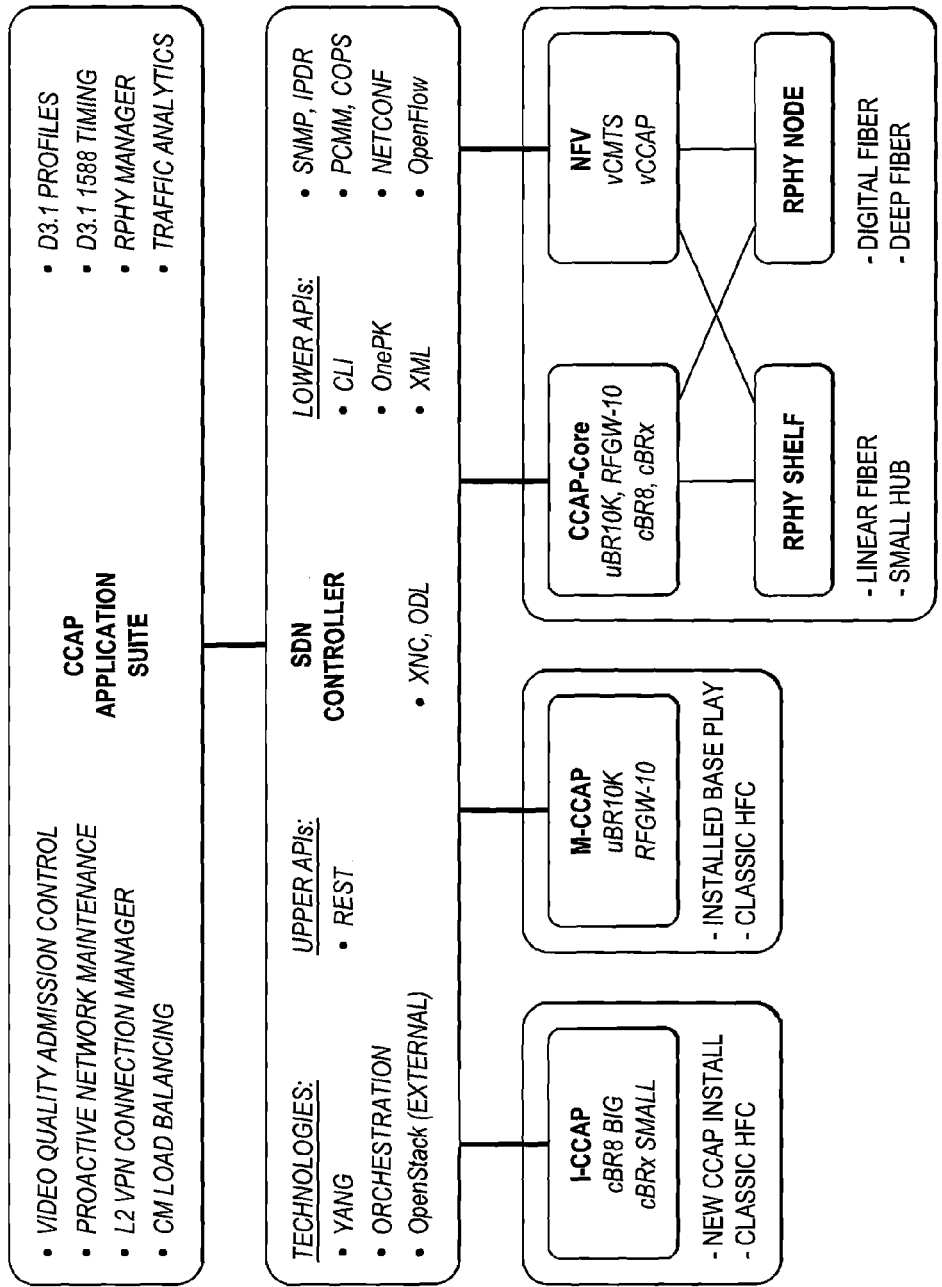
FIG. 4 is a simplified block diagram illustrating a potential cloud network environment in accordance with one embodiment of the present disclosure.
Figure 5:
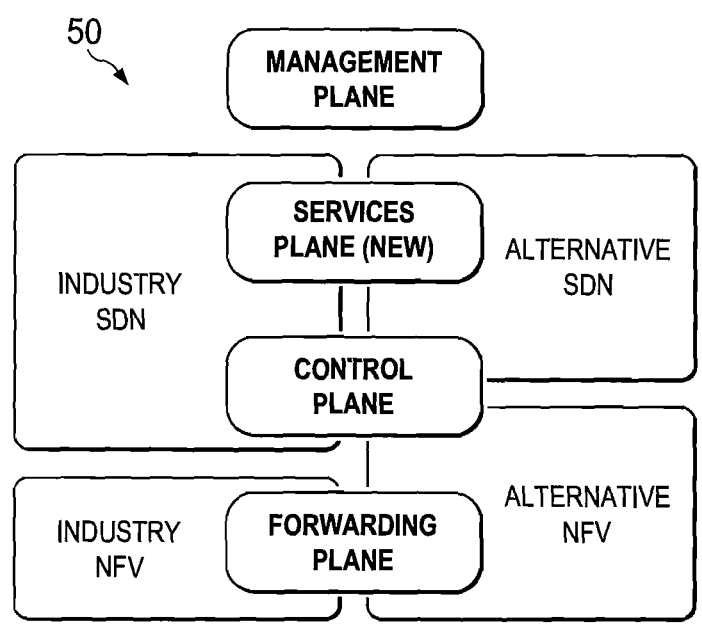
FIG. 5 is a simplified block diagram illustrating a plurality of planes in accordance with one embodiment of the present disclosure.

FIG. 4 is a simplified block diagram that illustrates an example cloud configuration 45 that may be used in conjunction with the present disclosure. In the example of FIG. 4, a Converged Cable Access Platform (CCPA) application suite is provided, along with an SDN controller that can include any number of application program interfaces (APIs) as is being shown. Note that this particular example of FIG. 4 lists only some, of the many possible technologies and APIs that can be used in conjunction with the present disclosure. FIG. 5 illustrates one potential logical representation 50 of a management plane, a services plane, a control plane, and a forwarding plane and, further, how such planes can be integrated and managed from the perspective of an Industry SDN and an Industry Network Function Virtualization (NFV). In at least one example, the present disclosure can use an alternative framework associated with the alternative SDN and alternative NFV, as is being illustrated by FIG. 5.

Note that in terms of the terminology discussed herein, the term 'channel' can be used to refer to an OFDM channel, (e.g., a common FFT that is typically 192 MHz). The term 'template' can refer to a list of sub-carriers, their functions (data, pilot, guard, etc.), and locations. The term 'slice' can refer to a fraction of the downstream OFDM channel that has a specific membership group of CMs. The term 'profile' can include any suitable list of modulations for each data-subcarrier in an OFDM channel. The Convergence Layer can be abbreviated CL and the CL control channel (CLCC) can include the Next Profile Pointer (NPP), a Timestamp, and a Message Channel. Additionally, the MAC Management Message can be abbreviated MMM.

The data channel can be comprised of data slices, where each slice can include a CM membership group. A CM may be a member of one or more slices. The physical characteristics of the data sub-carriers used in the OFDM channel can be provided in a profile. Each data slice can reference a profile in certain embodiments of the present disclosure. There may be more slices than profiles. Thus, more than one slice may share the same profile (e.g., a Light Sleep mode). The control channel can be composed of message blocks. The control channel can include the NPP and any suitable timestamp. The control channel can include a CL message channel for select MAC Management Messages.

Figure 6:
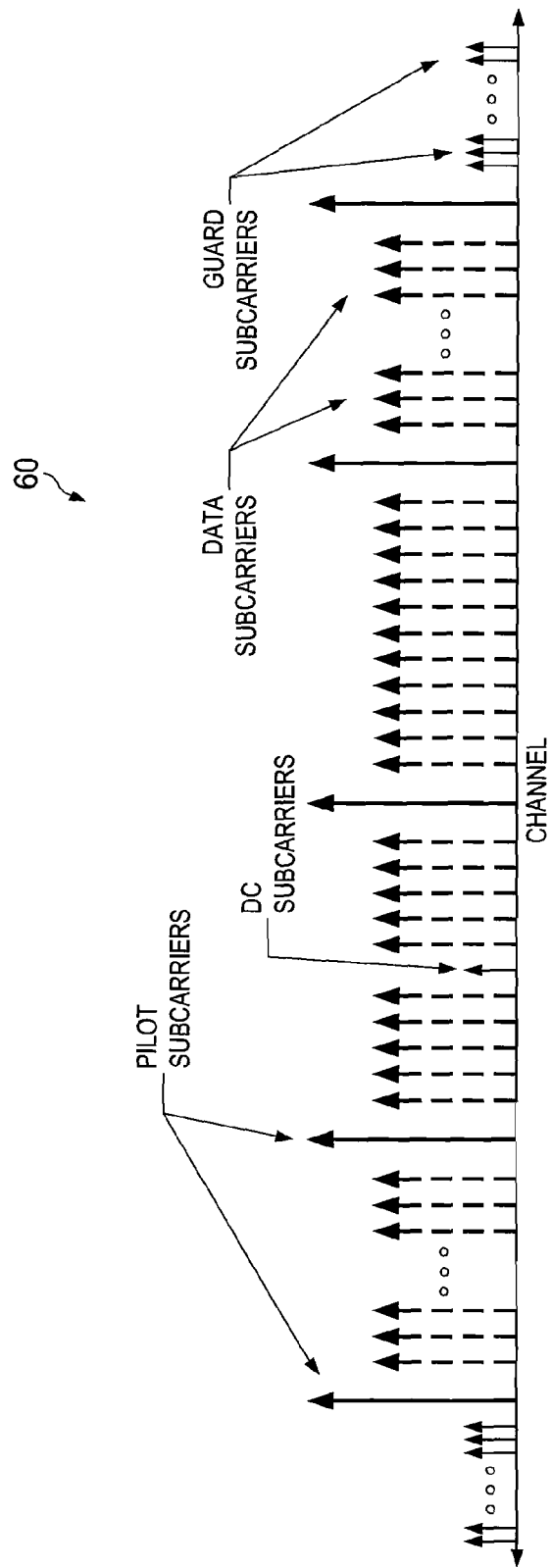
FIG. 6 illustrates an example graph associated with subcarriers in accordance with one embodiment of the present disclosure.
Figure 7:
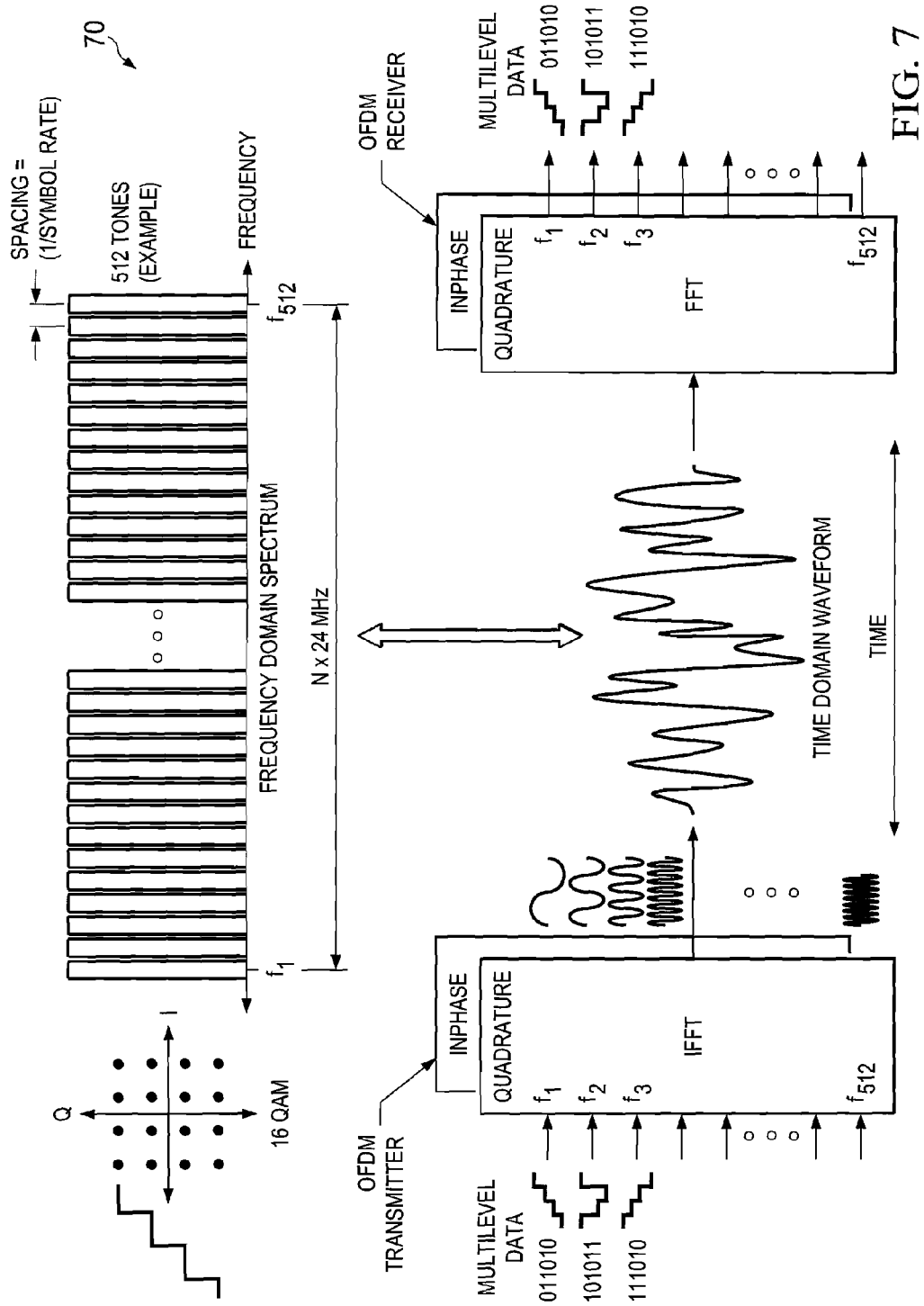
FIG. 7 illustrates an example schematic associated with orthogonal frequency-division multiplexing (OFDM) in accordance with one embodiment of the present disclosure.

In terms of OFDM background, FIG. 6 illustrates a graph 60 associated with pilot subcarriers, data subcarriers, guard subcarriers, etc. As a general proposition, orthogonal frequency division multiplexing is a large collection of narrow quadrature amplitude modulation (QAM) subcarriers. FIG. 7 illustrates an example schematic 70 associated with OFDM, where iFFT=inverse FFT, an iFFT converts from the frequency domain to the time domain, and an FFT converts from the time domain to the frequency domain.

Cable networks have previously used frequency division multiplexing (FDM) to allow the transmission of several RF signals through the same length of coaxial cable at the same time. Each RF signal is on a separate frequency or, more specifically, assigned to its own channel slot. National Television System Committee (NTSC) analog TV signals each occupy six megahertz of bandwidth, and each six-megahertz-wide chunk of spectrum is a channel. A color subcarrier is located in between the visual and aural carriers, approximately 3.58 MHz above the visual carrier. As the cable industry moved to digital transmission, the modulation of choice was QAM. Each downstream QAM signal occupies the same six megahertz of bandwidth as an analog TV signal. The current method of QAM transmission is known as single carrier QAM (SC-QAM); the latter is true even when DOCSIS 3.0 channel bonding is used. Each channel slot carries only one modulated carrier (a QAM signal) hence, the SC-QAM moniker. The entire data payload transmitted in the channel modulates just that one QAM signal.

Each of the narrow QAM signals, called a subcarrier, subchannel, or tone, carries a small percentage of the total payload at a low data rate. The aggregate of the subcarriers' data rates comprises the total data payload. This variation of FDM is known as OFDM. For improved spectral efficiency, the subcarriers can overlap one another. This sounds counterintuitive because if signals overlap each other interference can occur. With OFDM, the subcarriers are mathematically orthogonal to (i.e., distinguishable from) one another, which addresses the interference concern. "Orthogonal" in this case simply refers to the subcarriers being independent such that there is no interaction between them despite the overlap in frequency. The concept is analogous to having zero intersymbol interference (ISI) in the time domain.

Orthogonality can be achieved by spacing the subcarriers at the reciprocal of the symbol period (T), also called symbol duration time. This spacing results in the sin (sin x/x) frequency response curves of the subcarriers lining up so that the peak of one subcarrier's response curve falls on the first nulls of the lower and upper adjacent subcarriers' response curves. Orthogonal subcarriers each have an integer number of cycles in the interval T.

OFDM can be used for multiple access by assigning different subcarriers to different users. OFDM also can be used in combination with such other multiple access schemes as time division multiple access (TDMA). In this case, the full channel would be assigned to one user at a time, and the multiple access achieved via time division. When combined with TDMA, OFDM can deliver a high peak-data rate, which may be desirable for some applications.

Figure 8:
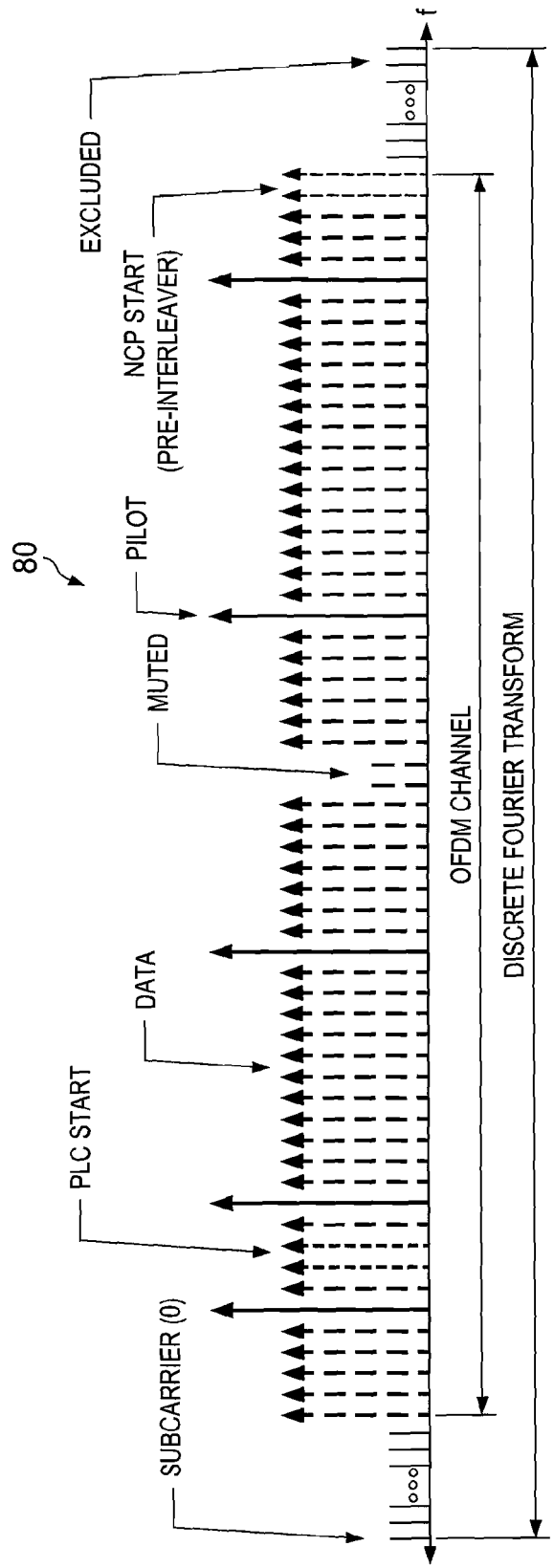
FIG. 8 is a schematic diagram illustrating an example of a subcarrier assignment in accordance with one embodiment of the present disclosure.

Turning to FIG. 8, FIG. 8 is a schematic diagram 80 illustrating an example of a subcarrier assignment. More specifically, this illustration shows an OFDM channel with PLC after interleaving. The OFDM spectrum is illustrated in FIG. 8 and, further, described by two messages OFDM Channel Descriptor (OCD) and Downstream Profile Descriptor (DPD). On the left is subcarrier(0), which is the first numbered subcarrier and is typically an excluded carrier. The outer 6.4 MHz past each end of the 192 MHz maximum spectrum is excluded. There are fixed pilot tones described by OCD and DPD and scattered pilots are that algorithmically described and not described by OCD and DPD. The PLC starts somewhere in the spectrum. There are data subcarriers that carry DOCSIS frames. Some subcarriers are muted on a per-profile basis. There is also an NCP channel that points to codeword locations. Although the NCP channel is shown at the top end of the spectrum, it is actually spread through the spectrum as it is frequency and time interleaved along with the data carriers.

The OCD message generally assigns static functions like PLC usage, excluded subcarriers, and continuous pilots. Any subcarrier that has not been defined as an excluded subcarrier or a continuous pilot is considered as an active data subcarrier. The DPD message defines the active data subcarriers with values such as muting and modulation. These values can change from one profile to another in accordance with the teachings of the present disclosure. The exception to this guideline is that continuous pilots can be assigned with the DPD vector. The same list/range type-length-value (TLV) structure can be used for the subcarrier assignment in both the OCD and DPD messages, although the usage is different for each message. The DPD message also has an alternate method of describing spectrum usage based upon a vector structure.

When the subcarrier assignment TLV is used in range mode, the length of the value field can be about 5 bytes. When the subcarrier assignment TLV is used as a list, the length is variable up to a maximum of 255 bytes. The number of list entries can be (length−1)/2. Thus, the maximum number of list entries can be 127 entries. A range is defined by a starting subcarrier index and an ending subcarrier index. The ending subcarrier index can equal the beginning subcarrier index, but should not be less.

A continuous range can mean that the subcarrier assignment applies to subcarriers within the specified range. A range with a skip value of one can mean that one subcarrier is skipped and that every second subcarrier would be assigned, beginning with the start subcarrier. The skip range is intended to be used to define mixed modulation profiles. Any suitable list entry is one or more discrete subcarrier indexes. In certain embodiments, the CMTS can repeat the subcarrier assignment TLV as many times as necessary within the OCD message and within the DPD message to complete the description of the entire OFDM channel.

For default and specific values, the subcarrier assignment range/list TLV has a default mode. Subcarriers can be assigned a default value that can then subsequently be overwritten with a specific value. For example, the subcarrier TLV could be issued once with active data subcarriers set to a default modulation. The TLV could be issued again with discrete active data subcarriers listed that might use a different modulation. This dual assignment can be unique within each of the OCD and DPD messages since OCD and DPD assign different functions to different subcarriers. The use of a default value and specific value introduces multiple assignment of a subcarrier. The use of two messages also introduces the possibility of multiple assignments. The following requirements remove all ambiguity.

In accordance with one example embodiment, the subcarrier assignments defined by NCP and by scattered subcarriers have a higher precedence than subcarrier assignments in the OCD and DPD messages. The CMTS can assign at least one "default" or "specific" function to each subcarrier. The CMTS should not assign more than one "default" function per subcarrier per message. The CMTS should not assign more than one "specific" function per subcarrier per message. The CM can give first precedence to "specific" assignments of subcarriers by the OCD message. The CM can give second precedence to "default" assignments of subcarriers by the OCD message. The CM can give third precedence to "specific" assignments of subcarriers by the DPD message. The CM can give fourth precedence to "default" assignments of subcarriers by the DPD message. These provisions define TLV precedence explicitly and, thus, do not require TLVs to be transmitted in any defined order.

Subcarriers may also be assigned directly with a vector. A vector can include a starting subcarrier number and then a series of 4-bit modulation assignments. Note that the length field of the Subcarrier Assignment Vector can be two bytes instead of one byte. When evaluating rules, assignments by the vector TLV are considered "specific" assignments.

If the number of subcarriers described in the subcarrier assignment vector is an odd number, then the CMTS can assert the odd bit identifier and use a value of zero in the four least significant bits of the last byte of the vector. If the subcarrier assignment vector can be set to odd, the CM can ignore the four least significant bits of the last byte of the vector. For the OCD operation, the location of the PLC channel can be appropriately designated. This is typically done with one range. Excluded subcarriers can be identified. This is typically done with one or more ranges. Discrete continuous pilots can be identified. This is typically done with one or more lists. (Alternatively, continuous pilot assignment can also be done in the DPD vector).

For the DPD operation, default modulation can be assigned to active data subcarriers. This is typically done with one range and a default setting. This step may be skipped in certain embodiments of the present disclosure. Specific modulation can be assigned to active data subcarriers if they differ from the default. This is typically done with one or more ranges, one or more lists, or as part of a vector. Muted subcarriers can be assigned. This typically is done with one or more ranges, any suitable list, or as part of a vector, for example.

Figure 9:
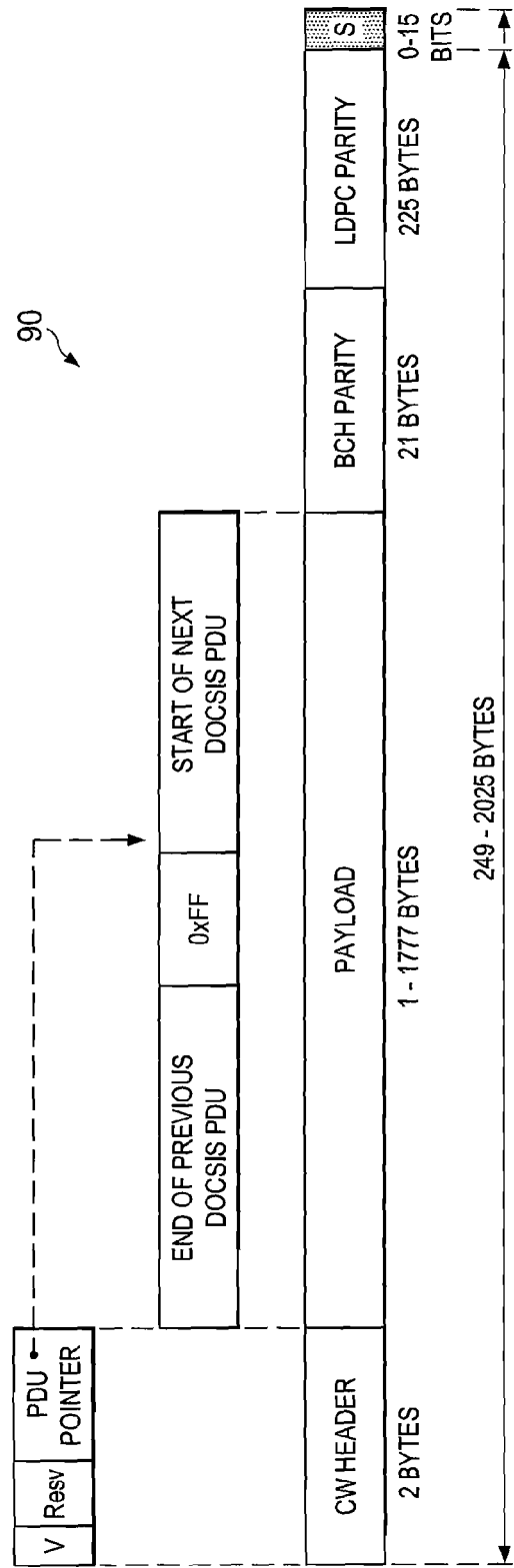
FIG. 9 illustrates an example Forward Error Correction (FEC) block diagram in accordance with one example embodiment of the present disclosure.

FIG. 9 illustrates an example Forward Error Correction (FEC) block diagram 90 in accordance with one example embodiment of the present disclosure. The FEC protocol adds redundant bits so that erred bits can be recreated. FEC can use an interleaver in order to be effective. It is more robust than Reed-Solomon and Bose Chaudhuri Hocquenghem (BCH) may be used as an outer FEC in certain example embodiment. For FEC parity, a full codeword can be about 16,200 bits, in one example configuration of the present disclosure. A short codeword is acceptable and the codeword can be 16-bit aligned with stuffing bits. For the FEC payload, this can be similar to D3.0 frame mapping to MPEG-TS. A 2-byte header can include the start of a packet pointer, where the data field is segmented DOCSIS frames.

Figure 10:
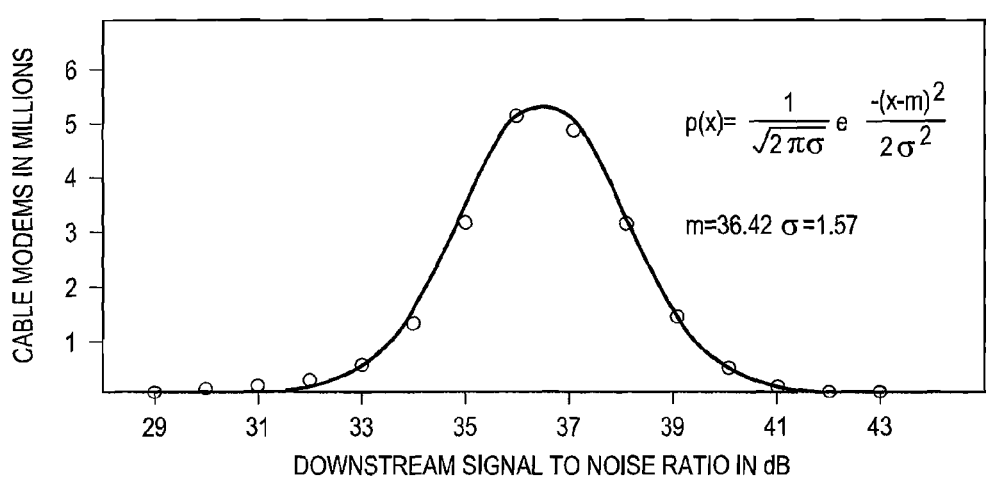
FIG. 10 illustrates an example graph associated with downstream profiles in accordance with one embodiment of the present disclosure.

Turning to FIG. 10, FIG. 10 illustrates an example graph 100 associated with downstream profiles in accordance with one embodiment of the present disclosure. DOCSIS 3.1 can offer downstream profiles for OFDM channels. A profile includes any suitable list of modulation orders that are defined for each of the subcarriers within an OFDM channel, as defined by the Downstream Profile Descriptor (DPD). The CMTS can also define multiple profiles for use in an OFDM channel, where the profiles can differ in the modulation orders assigned to each subcarrier. The CMTS can assign different profiles for different groups of CMs in certain embodiments of the present disclosure.

For convenience, each profile can be assigned a letter: Profile A, Profile B, and so forth. In this example, Profile A denotes the common profile that all CMs can receive and decode. A modem can use Profile A when it first initializes. Each OFDM channel has its own unique set of profiles. Thus, Profile A on OFDM channel 1 could be different from Profile A on OFDM channel 2. In DOCSIS protocol encodings, Profile Identifier 0 is commonly referred to as Profile A. Profile Identifiers 1, 2, and 3 are commonly referred to as Profiles B, C, and D, respectively.

Any profile can be used to send MMMs. The CMTS is responsible for making sure that MMMs are transmitted on appropriate profiles such that a CM can receive them. The CMTS can ensure that the CM does not receive duplicate MMMs on a single OFDM channel. One way the CMTS can satisfy this requirement is to transmit broadcast and multicast MMMs on Profile A. The parameters that describe the OFDM downstream channel and each profile on that channel are defined in OFDM Channel Descriptor (OCD) and Downstream Profile Descriptor (DPD) messages, respectively.

The CMTS transmits the OCD message on the Physical Link Channel (PLC) and Profile A. The CMTS transmits the DPD message for each profile it supports on Profile A of the OFDM channel. The CMTS also transmits the DPD for Profile A on the PLC. There is also a dedicated profile for the Next Codeword Pointer (NCP). The NCP profile indicates which subcarriers are usable for NCP and which modulation on each subcarrier is to be used. For CM and CMTS profile support, the latency incurred by the codeword builder of the MAC-PHY Convergence Layer increases as the number of profiles supported by the CMTS increases on this channel, and as the OFDM channel bandwidth decreases. As such, the number of profiles supported by the CMTS can be defined according to the latency budgets at the codeword builder, as well as the available bandwidth for an OFDM channel.

Figures 11, 12:
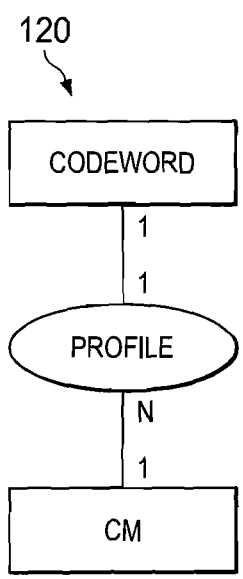
FIG. 11 illustrates an example table associated with codeword builder latency in accordance with one embodiment of the present disclosure.
FIG. 12 is a simplified block diagram that reflects a codeword and profile relationship in accordance with one embodiment of the present disclosure.

FIG. 11 illustrates an example table 110 associated with codeword builder latency in accordance with one embodiment of the present disclosure. The CMTS can support at least four profiles per CM in certain embodiments of the present disclosure. The CMTS can support at least four profiles for a 24 MHz OFDM channel with the codeword maximum latency targets that are provided. For example, the CMTS can support sixteen profiles for a 192 MHz OFDM channel with the codeword maximum latency targets defined.

In operation, the CMTS can assign a transition profile in order to test the ability of a CM to receive a new set of profile parameters for an OFDM channel. A transition profile assigned to a CM is not used by the CMTS to send downstream (DS) traffic to that modem. The CM can report its reception conditions of the transition profiles to the CMTS using any suitable protocol. The CMTS can use the transition profile in a variety of ways. For example, based on the values reported, the CMTS can decide to assign additional profiles to a CM after registration, or change the definition of an existing profile.

In accordance with one example configuration, the CM can support at least four profiles and a transition profile for each OFDM channel. After CM registration, the CMTS uses any DS profile assigned to the CM to send downstream traffic. The CM can forward traffic received on all of its assigned DS profiles. The CM should not forward DS traffic sent over the profiles it is not assigned to receive. For changes to the profiles, changes to operating conditions can occur due to changes in the PHY characteristics of the HFC network, CMs leaving or joining the network, or as a result of administrative controls, etc. The CMTS can react to these changes by changing the DS profiles.

For service flow to profile mapping, for a bonded downstream service flow, the CMTS can transmit the packets belonging to that service flow on more than one channel. For bonded downstream service flows, the CM can perform the resequencing operations across the different channels and does not resequence over multiple profiles within the same OFDM channel. The CMTS can transmit the packets of a downstream service flow on a single profile in an OFDM channel.

Hence, the framework of the present disclosure has the capability to have multiple downstream modulation profiles. The CMTS could have the ability to test and measure the receive capability of each CM and assign it to one of those modulation profiles. In the case of provisioning four downstream profiles, the first profile might be predominantly 256-QAM. This profile would be used for initializing CMs, sending MAC Management Messages, and carrying data for CMs with lower downstream carrier to noise ratios. 1024-QAM, 2048-QAM, and 4096-QAM could dominate the remaining three profiles respectively and be used for CMs that are on progressively better areas of the HFC plant. It is worth noting that, unlike wireless environments such as LTE or WiFi, each CM does not need its own profile. This is because the HFC plant is generally stable and well-engineered. Thus, with just a few modulation profiles, DOCSIS 3.1 is able to balance simplicity and cost with the ability to get the maximum performance out of the HFC plant.

The CMTS could have more total profiles than each CM in certain embodiments of the present disclosure. The HFC plant can have at least an 8 dB variation in CNR across the HFC plant. This variation can permit different modulations to be used on different locations. CMs could be arranged in a finite number of groups, each with its own modulation profile in certain embodiments of the present disclosure. Multiple downstream profiles could enable operators to leverage SNR variation to improve system capacity FIG. 12 is a simplified block diagram 120 that reflects the codeword and profile relationship in accordance with one embodiment of the present disclosure. Each profile can have a particular CM membership group. On a given HFC plant, CMs may be able to receive one or more profiles. Profile A could be common to CMs and contain MMM. Profiles B-D could be higher in modulation and serve a particular CM group. The CMTS can manage these multiple paths. Packets are associated with a profile on a channel based upon forwarding rules. Rules consider CM membership and packet type (unicast, multicast, MMM, ARP). A Service Flow can propagate along one path in accordance with one embodiment of the present disclosure.

For profile management, from the perspective of the CM, the CM report modulation error ratio (MER)/contrast-to-noise ratio (CNR) and receive power of each sub-carrier. The CM can test its ability to receive unused profiles and report the result. For the CMTS, the CMTS updates and publishes profiles. The CMTS can assign CMs to particular profiles. For Static Profiles, a single profile could be the same modulation. Due to downstream time and frequency interleaving, this can perform sufficiently well. For Dynamic Profiles, these can be measured, modified, and appropriately sorted. If one CM has a problem, it would move to a new profile. If 100 CMs encounter problems, the profile can be suitably updated.

Figure 13:
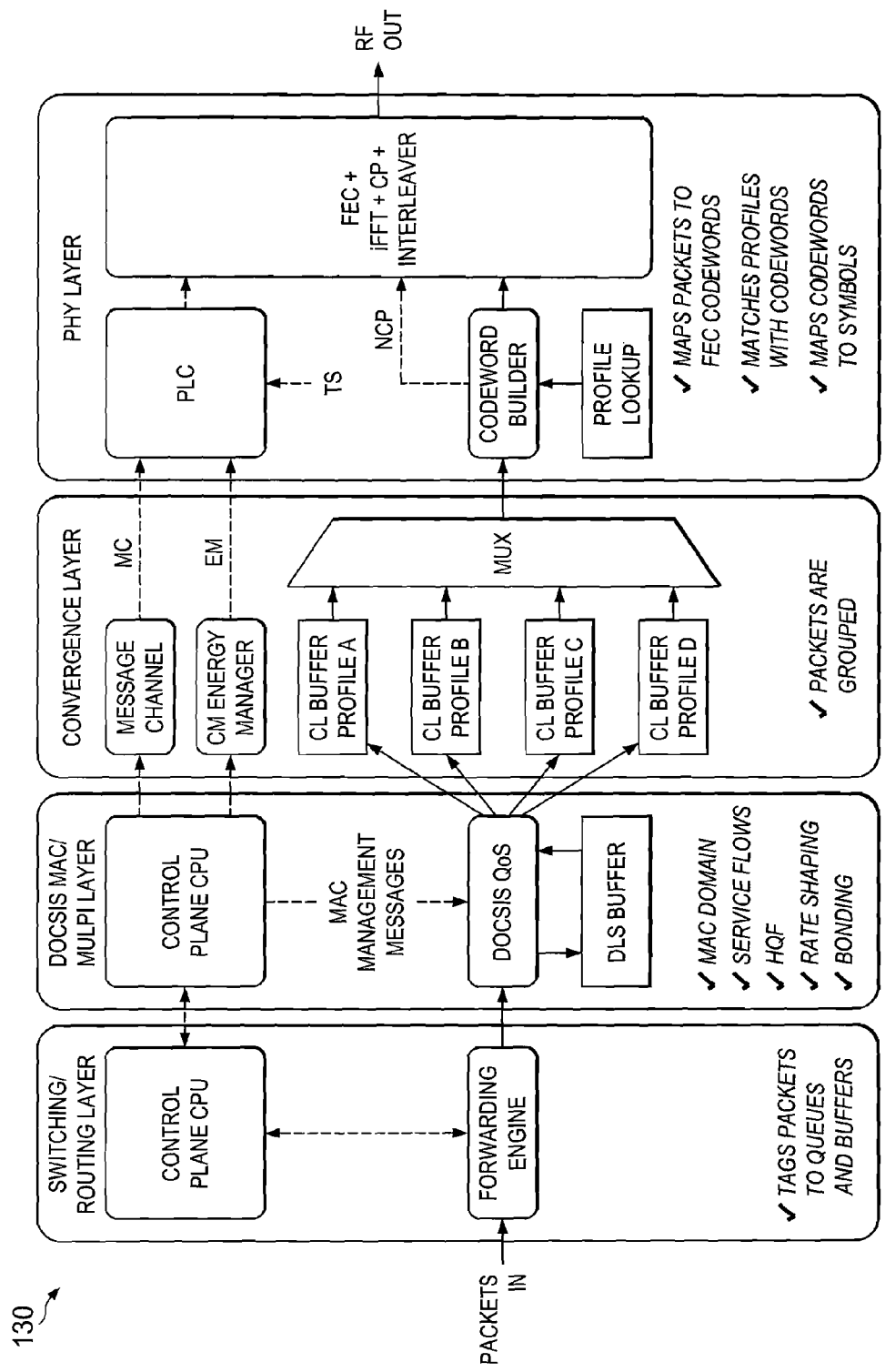
FIG. 13 is a simplified block diagram that reflects one possible configuration for the downstream (DS) framework in accordance with one embodiment of the present disclosure.

FIG. 13 is a simplified block diagram 130 that reflects one possible configuration for the downstream (DS) framework in accordance with one embodiment of the present disclosure. For the DS Convergence Layer, the NCP can point to codewords containing DOCSIS frames. The PLC can provide timestamp, energy management, and boot info for CMs. The DLS can allow CM low power mode and the DTP allows IEEE-1588v2 integration. The downstream includes a PHY layer with OFDM and LDPC. It also offers options for new spectrum usage. Additionally, it can cost-effectively scale to approximately 10+Gbps in the downstream path and approximately 2.5+Gbps in the upstream path in certain embodiments of the present disclosure.

Figure 14:
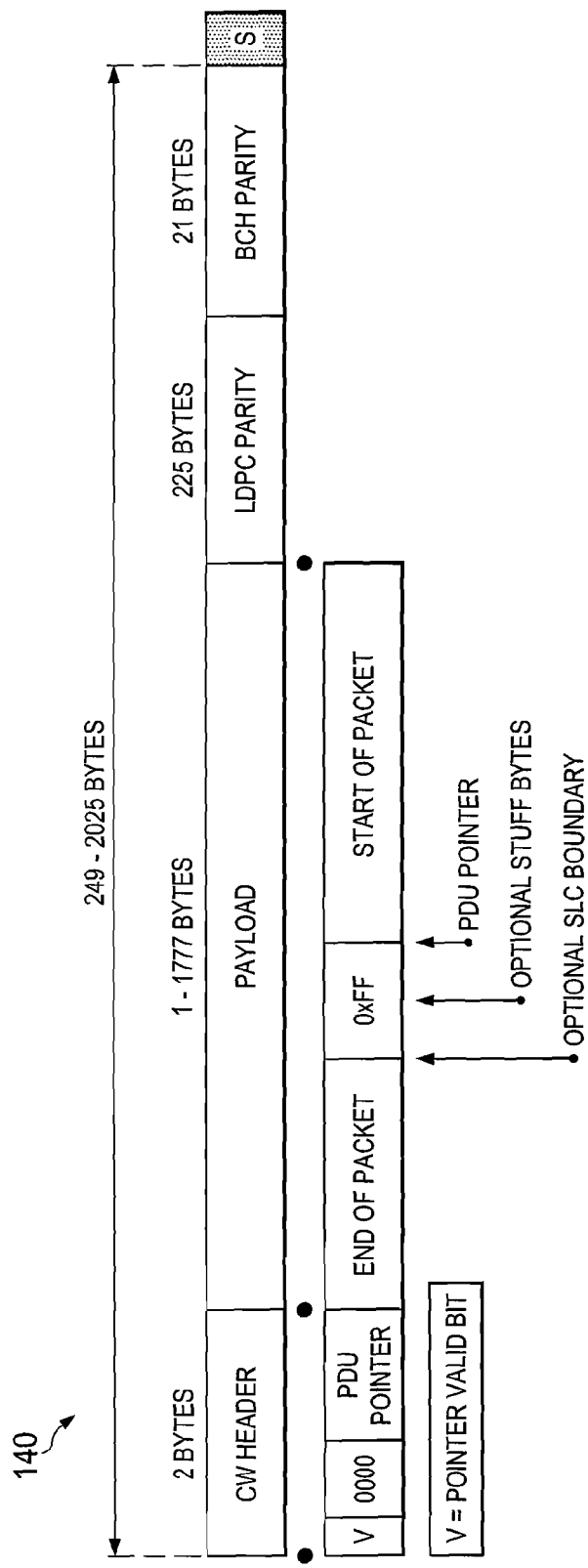
FIG. 14 is a simplified block diagram that reflects one possible mapping configuration for mapping packets to FEC blocks in accordance with one embodiment of the present disclosure.

FIG. 14 is a simplified block diagram 140 that reflects one possible mapping configuration for mapping packets to FEC blocks in accordance with one embodiment of the present disclosure. In LDPC, shortened codewords take more processing time in the receiver than fully formed codewords. Packets can be split across codewords belonging to the same profile. A shortened codeword should be used if there are not enough data bytes to fill one long codeword within the latency budget. For the CMTS, the # total bytes can be provided as (header+payload+parity) and does not exceed 2025 bytes in certain embodiments of the present disclosure. If (total bytes=odd), then this is sent to the FEC engine. If (total bytes=even), then one 0xFF pad byte is added after the last PDU and sent to a suitable FEC engine, processor, etc. A CMTS symbol mapper can add trailing bits to map a codeword to a symbol boundary. For the CM, the CM extracts total bits between two NCP pointers. In certain cases, if the total bits >16200, the system can use initial 16200 bits. If the total bits=16200, a full codeword is declared. If the total bits <16200, the system can discard [(total bits+8) Modulo 16] bits. An algorithm can allow the CMTS symbol mapper to add bits at the end of the codeword, and the CM to remove those bits before doing a FEC decode in certain embodiments of the present disclosure.

For the CMTS, the CMTS systematically builds codewords (regular codeword is 2025 bytes). For example, if the (total bytes=2024), add one 0xFF padding byte to the payload. If the (total bytes=2023), the system can add two 0xFF padding bytes to the payload. One 0xFF byte could be added after the end of a PDU. If the (total bytes <2023), then shortened last codewords are created to be an even number of bytes (max=2022, min=250, for FEC 8/9). For the CM, the CM can extract bits between two NCP pointers. If the bits >16200, the system can discard trailing bits up to the end of the current sub-carrier. If the bits=16200 (2025 bytes), a full codeword is declared. If the bits <16200, bits are rounded down to a 16 bit boundary (e.g., a two-byte boundary).

Figure 15:
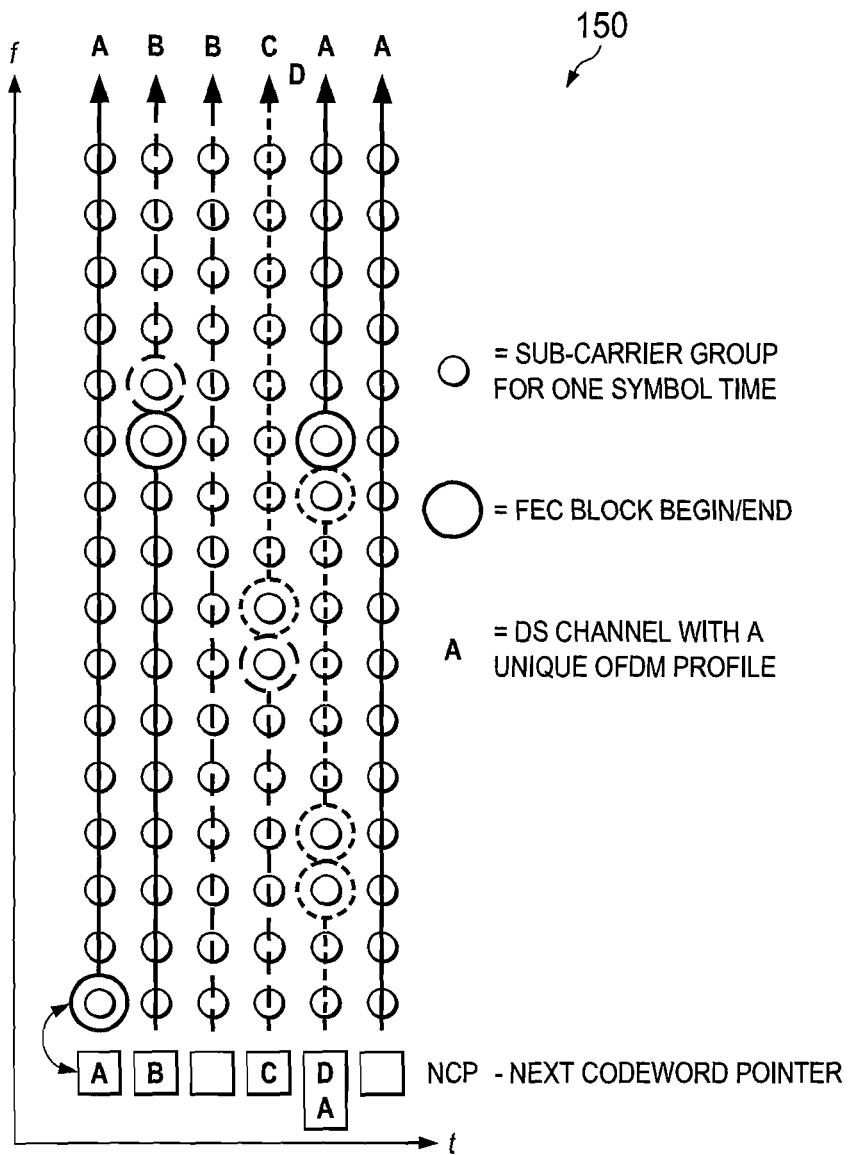
FIG. 15 illustrates an example schematic associated with a plurality of DOCSIS frames and the FEC in accordance with one embodiment of the present disclosure.

FIG. 15 illustrates an example schematic 150 associated with a plurality of DOCSIS frames and the FEC in accordance with one embodiment of the present disclosure. This view is prior to interleaving, where the packets can be mapped to FEC codewords. FEC codewords are mapped across sub-carriers, one symbol at a time and this can create a serial bit stream. The profile associated with the CM group can determine the sub-carrier bit loading. Codewords can start on a sub-carrier boundary. The dots of FIG. 15 represent the intersection of a symbol (vertical) and a subcarrier (horizontal). Codewords are mapped "vertically" across subcarriers (horizontal), one symbol (vertical) at a time. This can create a serial bit stream in accordance with example embodiments of the present disclosure. Codewords can start on a sub-carrier boundary. Shortened codewords could become more sensitive to frequency-based noise interference. This can be mitigated with frequency interleaving in certain environments of the present disclosure.

Figure 16:
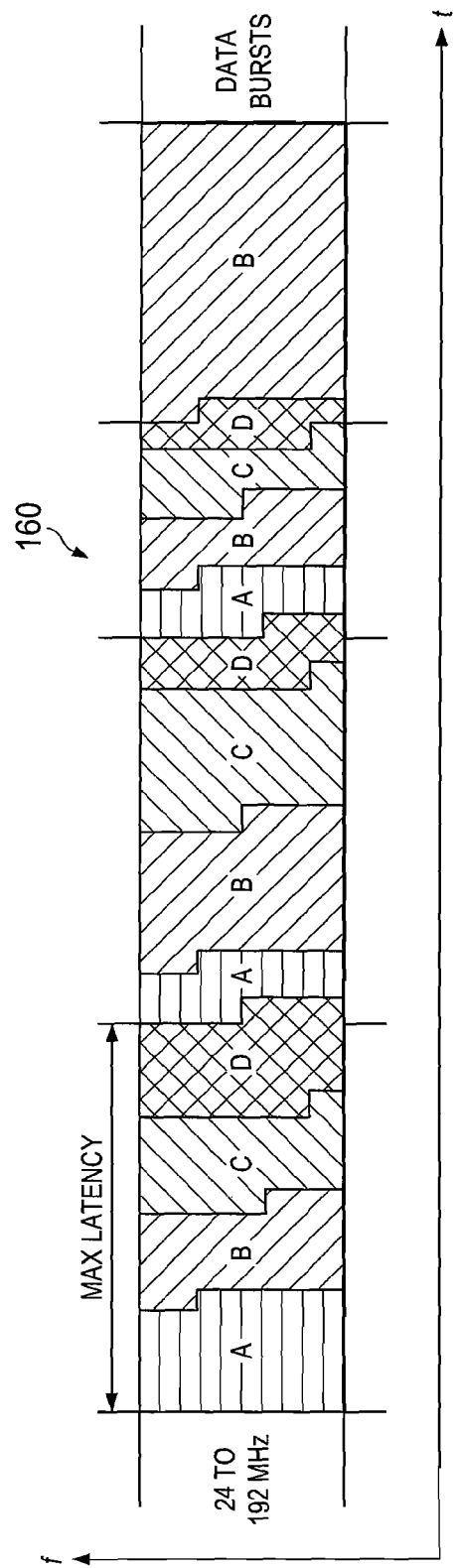
FIG. 16 illustrates an example schematic associated with time-frequency scheduling in accordance with one embodiment of the present disclosure.

FIG. 16 illustrates an example schematic 160 associated with time-frequency scheduling in accordance with one embodiment of the present disclosure. Profiles can span one or more codewords in certain embodiments of the present disclosure. Profiles can occur in any order or combination. In one particular example, the target max delay time for any one profile is 200 us. Packets are placed into FEC codewords and each codeword is associated with a profile (A, B, C, D). Codewords can be suitably multiplexed. Profiles can occur in any order or combination and for multiple channels, 5 OFDM channels can fill the new downstream spectrum. Channels are independent and each profile can be different in each channel (e.g., 54 MHz/42 MHz=1.286, 258 MHz=204 MHz×1.265).

The aggregate OFDM channel capacity can change when profiles are updated. This is a slow and small change. As packet distribution across profile changes, this is a fast and large change. If profiles vary over frequency, then the start/end locations impact throughput. This can be an error factor. DOCSIS rate-shaping software can perform on-going channel estimation. For the interleaver, codeword bits are interleaved across sub-carriers with a deterministic pattern. Symbols can be time-interleaved per sub-carrier. In summary, the MAC can rate-shape packets and provide an appropriate quality of service (QoS). Packets can be placed into FEC codewords. Each FEC codeword is associated with a profile and profiles describe the downstream modulations that each group of CMs use. The symbol builder in the convergence layer is allowed to reorder packets to make the PHY more efficient.

Figure 17:
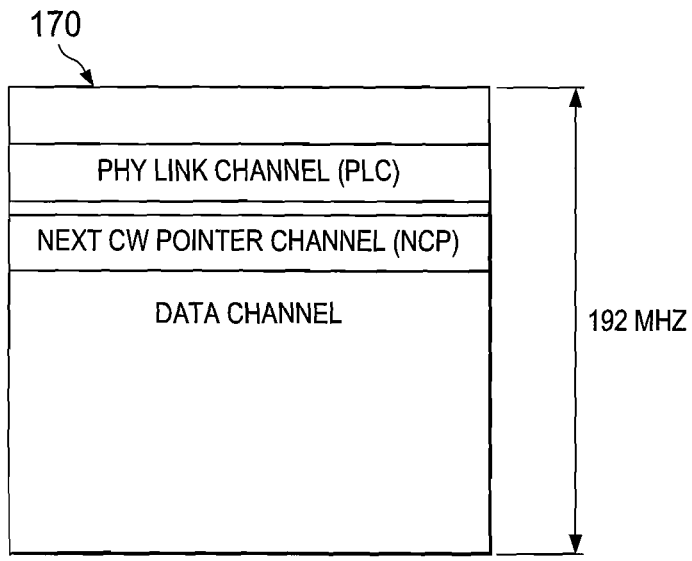
FIG. 17 illustrates an example schematic associated with OFDM channel components in accordance with one embodiment of the present disclosure.

FIG. 17 illustrates an example schematic 170 associated with OFDM channel components in accordance with one embodiment of the present disclosure. The OFDM channel can include the data channel (user data and MAC Management Messages (MMM)). The NCP channel can identify codewords and profiles. The PHY Link Channel (PLC) is located in the downstream convergence layer in certain example embodiments of the present disclosure. It is used for several tasks including timestamp, energy management, and as a message channel for bringing new CMs on line. The PLC offers CM initialization and control. The NCP channel and the data channel share the same time and frequency interleaver. The PLC channel is not necessarily interleaved in example configurations of the present disclosure. The PLC channel has a preamble and the data channel does not have a preamble in certain embodiments of the present disclosure.

The CMTS can assign a unique PLC to each OFDM channel. If there is more than one OFDM channel, the CM can be directed as to which PLC would be the primary PLC for the CM. When the CM initializes, it first locates a PLC channel. It then acquires just enough configuration information to join a primary downstream profile in the main OFDM channel. From there, it receives further configuration information. In general, data is provided in FEC codewords and the NCP points to codewords. The PLC can be used for booting CMs. The NCP can be interleaved with the data across the entire channel in example embodiments of the present disclosure.

Figure 18:
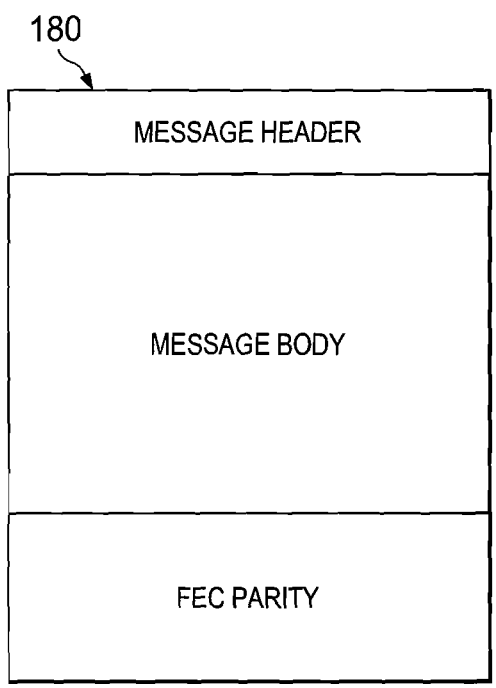
FIG. 18 illustrates an example schematic associated with an example message block in accordance with one embodiment of the present disclosure.

FIG. 18 illustrates an example schematic 180 associated with an example message block in accordance with one embodiment of the present disclosure. The message block (MB) is a building block of the D3.1 PLC. The MB can be cascaded and the message header can be 1 byte in certain example embodiments of the present disclosure. It can contain a type field and a small parameter field. The message body can include variable bytes. The parameter field includes the FEC parity, and the type and length of FEC depends on the MB type.

Figure 20:
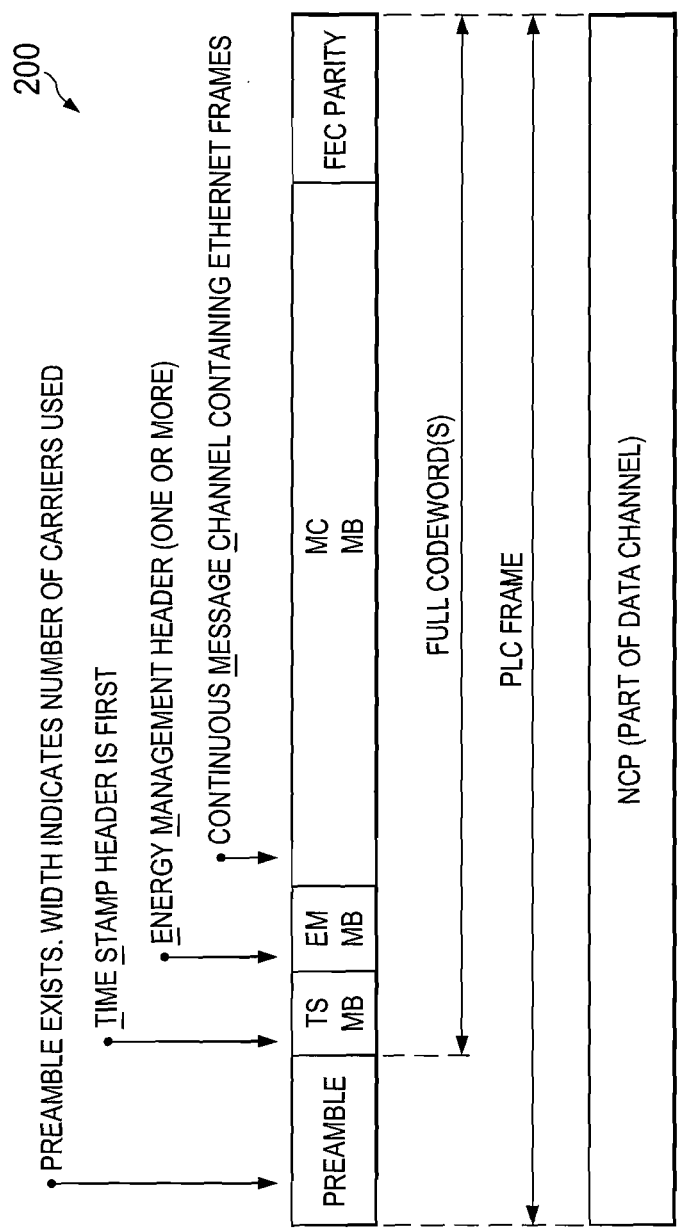

FIGS. 19-20 illustrates example configurations and packet formatting (190 and 200) associated with an example PLC in accordance with one embodiment of the present disclosure. A PLC frame could be 8, 16, or 32 carriers wide with one, two, or four codewords plus a preamble. In certain example embodiments, TS may not be in every frame. If the TS is present, it can be the first MB after the preamble. The EM may not be in every frame in certain cases. There can be multiple EMs per-frame. EMs can be generally after the TS (if present) or after the preamble if the TS is not present.

In certain embodiments, there is a preamble of 8 symbols at the beginning of a PLC frame that consists of a field of fixed pilots. There is no separate preamble for the OFDM data channel. The CM can search for the preamble and the adjacent pilots to lock onto the PLC. The data portion of the PLC consists of self-contained message blocks. In general, they are can be three types of message blocks:
  Timestamp Message Block (TS MB);
  Energy Management Message Block (EM MB); and
  Message Channel Message Block (MC MB).

Each message block can have a one one-byte header that consists of a type field, followed by configuration bits, followed by a data field. The timestamp and energy management message blocks can include a cyclic redundancy check (CRC) (e.g., CRC-24-D). The CRC for the message channel is included on the packets within the message channel rather than on the message block structure itself. The message blocks are then mapped into a shared set of consecutive FEC codewords. Thus, the contents of the TS and EM message blocks can be slightly delayed by the FEC codeword size and how that FEC codeword is mapped to the underlying symbols.

Figure 21:
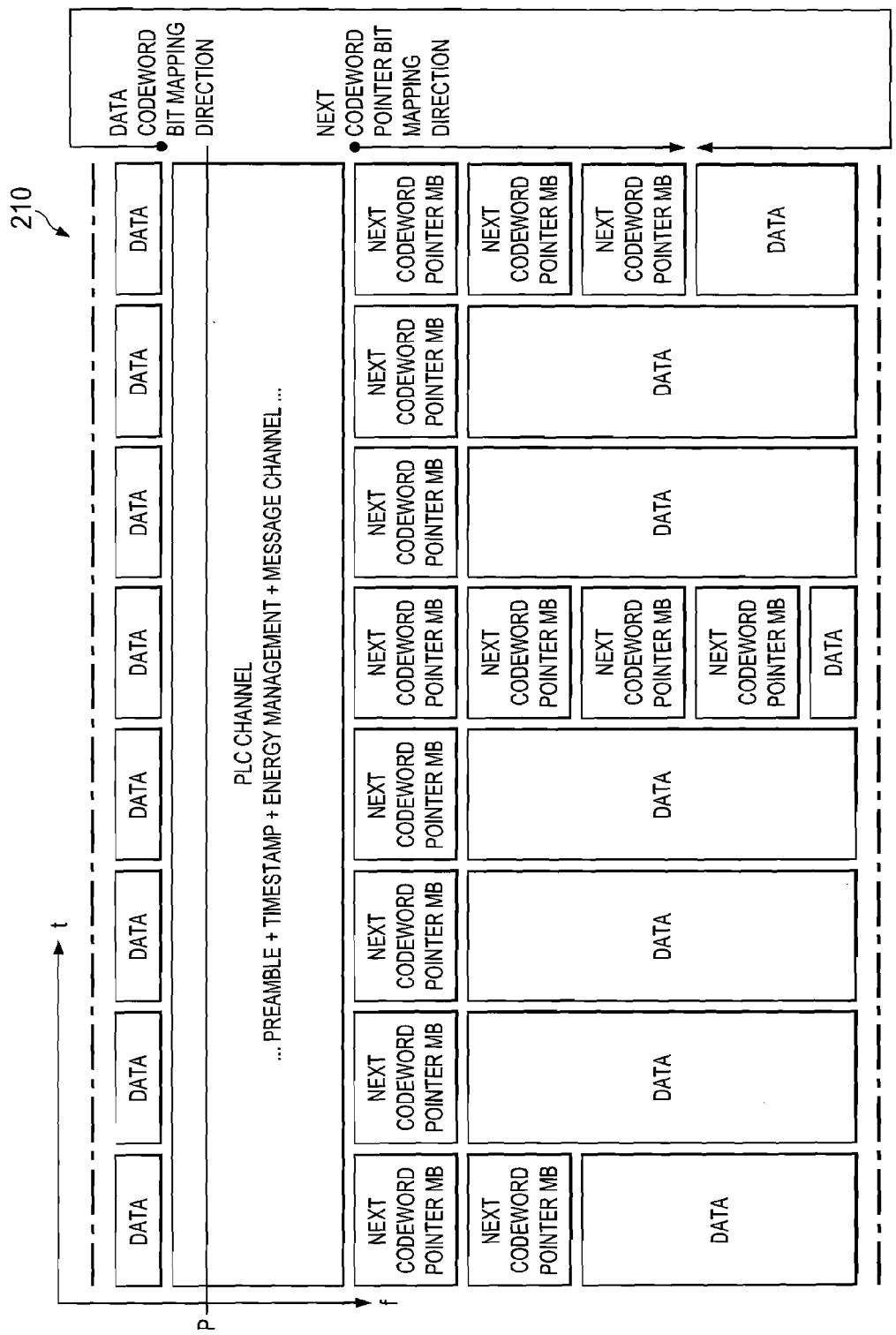
FIG. 21 illustrates an example schematic associated with a next codeword pointer (NCP) mapping in accordance with one embodiment of the present disclosure.

FIG. 21 illustrates an example schematic 210 associated with NCP mapping in accordance with one embodiment of the present disclosure. The NCP channel is separate from the PLC and does not have to be adjacent to the PLC. In certain example embodiments, there is no preamble in the NCP channel. Each NCP block has its own FEC. This allows quick use and allows for chaining. NCP blocks and FEC blocks build towards each other to allow a variable number of NPP blocks.

Figure 22:
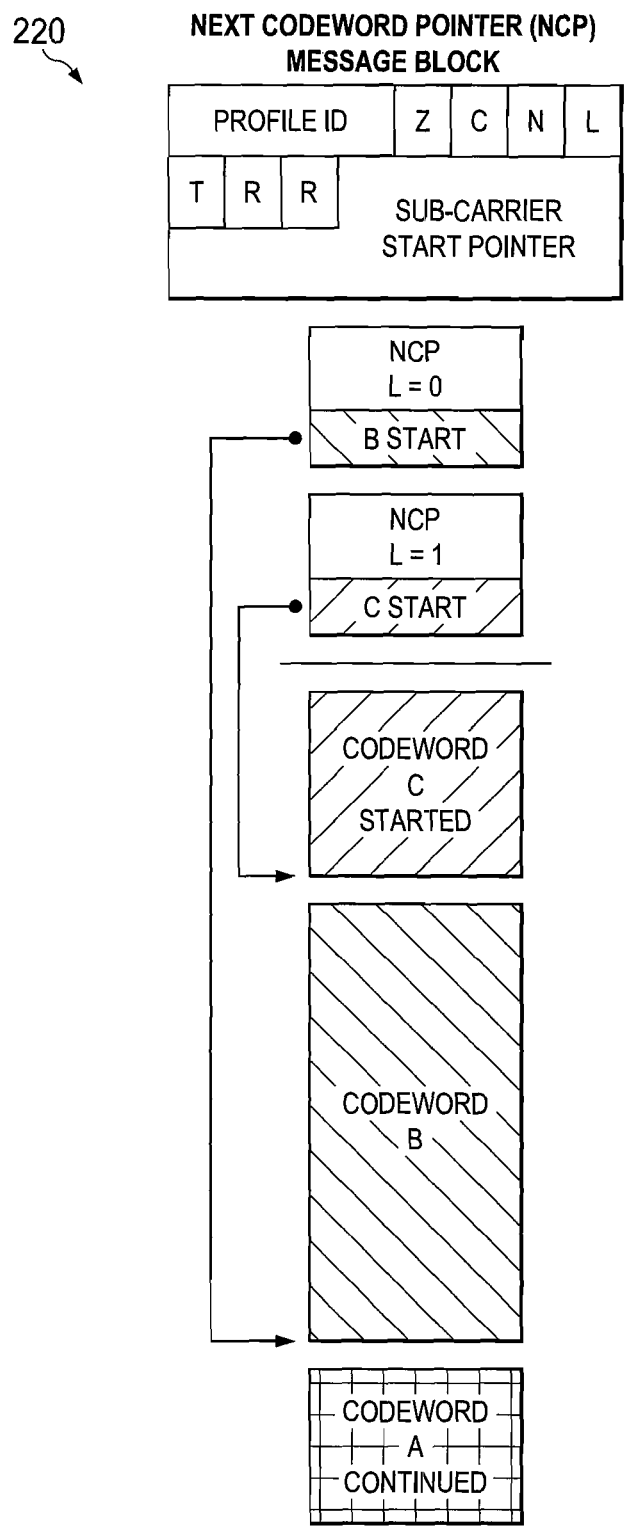
FIG. 22 illustrates an example schematic associated with an NCP message block in accordance with one embodiment of the present disclosure.

FIG. 22 illustrates an example schematic 220 associated with an NCP message block in accordance with one embodiment of the present disclosure. In this example, there is a profile ID, a "Z" bit for zero bit loading, a "C" bit for Profile Change, an "N" bit for NCP Update, an "L" bit for last NCP in symbol, and a "T" bit for directed testing. Hence, the PLC has four fundamental elements in this example configuration:
  Preamble: Initial CM Sync;
  TS: Timestamp;
  EM: Energy Management; and
  MC: Message Channel (for CM initialization).

These elements can be assigned to message blocks, which can be sized, linked, and multiplexed as needed. A fifth function is the codeword pointers that are located in a separate NCP channel. Operational MMM can be located on a standard profile such as profile A.

Figure 23:
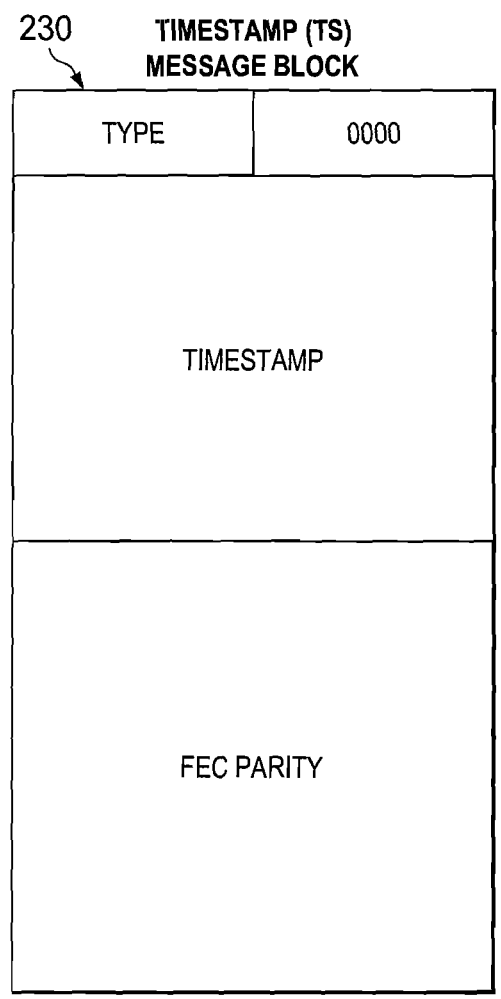
FIG. 23 illustrates an example schematic associated with a timestamp message block in accordance with one embodiment of the present disclosure.

FIG. 23 illustrates an example schematic 230 associated with a timestamp message block in accordance with one embodiment of the present disclosure. The timestamp MB can include the eight-byte DOCSIS timestamp. The TS MB can be the first MB after the preamble. The TS MB can appear in each PLC frame. The timestamp references the end of the last symbol of the preamble at the start of the PLC frame that can include the timestamp. The CMTS can locate the timestamp MB directly after the preamble on a primary-capable PLC. The CMTS can transmit the timestamp MB once in every PLC frame on a primary-capable PLC. The CMTS should not transmit the timestamp MB on a non-primary-capable PLC.

The TS MB can provide the D3.1 timestamp. The intended allocation of the bytes is: 4 extra EPOCH upper bytes, 4 middle bytes similar to DOCSIS 3.0, and 1 extra lower byte for additional precision in accordance with certain example embodiments. For energy management and sleep-mode operations, for the CMTS, the CM does not have to continuously listen to the control channel. The CMTS can allow the CM to move into an off-state that cannot be directly woken up. The CM can accept a sleep-timer message and can wake up when told. The sleep timer duration can be set by the CMTS. Typical values could be 10 to 200 ms, or any other suitable value, which may be based on particular needs.

Figure 24:
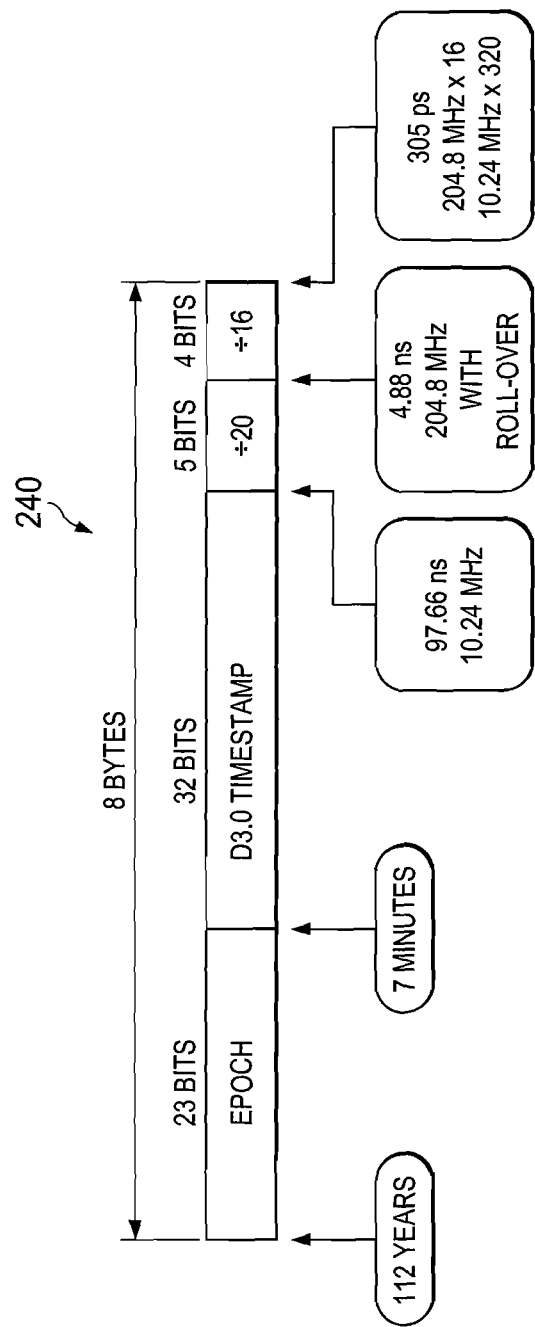
FIG. 24 illustrates an example formatting associated with an extended timestamp in accordance with one embodiment of the present disclosure.

FIG. 24 illustrates an example formatting associated with an extended timestamp 240 in accordance with one embodiment of the present disclosure. In general terms, the extended timestamp can be located on primary downstream channels. In one example embodiment, a 64-bit timestamp is used. The value of the timestamp can be referenced to the end of the PLC preamble. The extended timestamp has two additional features when compared to the original DOCSIS timestamp. First, the extended timestamp is now an absolute timestamp rather than a relative timestamp. Second, the extended timestamp has a higher degree of precision in certain example embodiments of the present disclosure.

The extended timestamp can include the concept of Epoch. Epoch refers to a point in time where the timestamp begins to count. The DOCSIS extended timestamp can use the same start time as IEEE 1588-2008, which is Midnight, Jan. 1, 1970. The DOCSIS extended timestamp uses the same method for counting as IEEE 1588-2008. This method is known as International Atomic Time (TAI). TAI moves forward monotonically and does not adjust for leap seconds. This differs from protocols such as Unix time that are adjusted for leap seconds.

There are 4 additional lower bits that allow either a higher clock resolution or the ability to communicate phase information within the 204.8 MHz clock. In a standalone CMTS system, these bits may be set to zero. In a system where the CMTS is synchronized to a network clock, these lower four bits may represent the phase of the network clock with respect to the DOCSIS clock. The next five bits of the DOCSIS extended timestamp can be used to divide the 204.8 MHz clock by 20 to produce a 10.24 MHz clock. These five bits are constructed such that the field could count from a value of 0b00000 to 0b10011 and then reset to 0b00000. The 10.24 MHz clock is then used to drive the remaining higher order bits. These bits include a 32-bit field that is compatible with the regular DOCSIS four-byte timestamp. The highest 23 bits extend the timestamp to a count high enough that the timestamp can be referenced to a known point in time.

Figure 25:
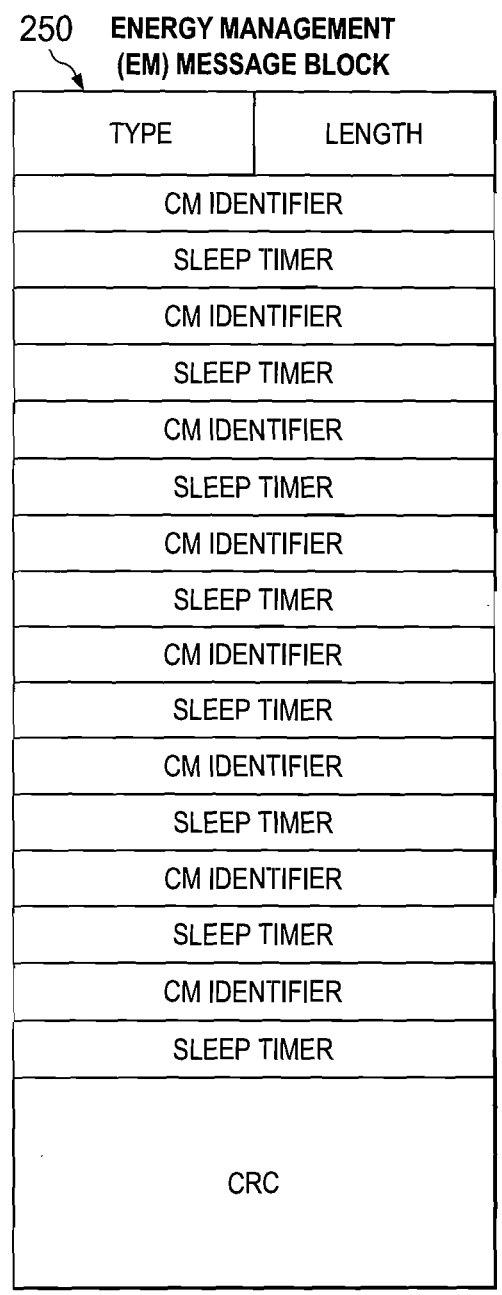
FIG. 25 illustrates an example formatting associated with an energy management message block in accordance with one embodiment of the present disclosure.

FIG. 25 illustrates an example formatting 250 associated with an energy management message block in accordance with one embodiment of the present disclosure. The EM block can set a sleep timer to wake up a group of CMs. The energy management message block (EM MB) can include messages that manage the DOCSIS Light Sleep (DLS) Mode, as discussed herein. The EM MB can include one or more entries, where each entry is associated with an EM group. The EM ID identifies a CM or a group of CMs and the EM ID can be assigned a point in the future, where the CM(s) are to wake up and listen to the PLC channel for a new EM message. The CMTS may put either zero or one EM MBs into the PLC frame. In one embodiment, the CMTS would not place an EM MB on a non-primary-capable PLC. If the EM MB is included, the CMTS can locate the EM MB directly after the TS MB. For the wake time reference field in the EM MB, the CMTS can point to the Timestamp Reference Point of the future PLC frame that can include the next EM MB that is to be received by the CMs in the corresponding DLS Group.

Figure 26:
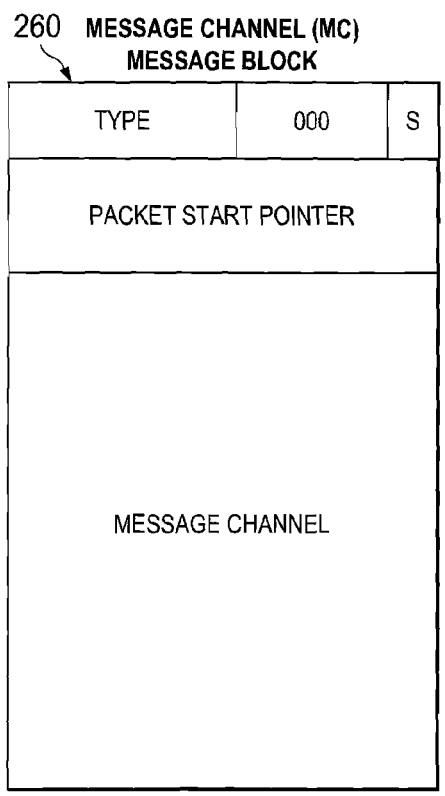
FIG. 26 illustrates an example formatting associated with a message channel message block in accordance with one embodiment of the present disclosure.

FIG. 26 illustrates an example formatting 260 associated with a message channel message block in accordance with one embodiment of the present disclosure. The MC MB provides an Ethernet channel for specific MMM. There is no FEC in the MC MB as FEC is provided by the PLC frame. The message channel connects the CMTS MAC to the CM MAC. The contents of the message block contain properly formatted DOCSIS MAC Management Messages. The CMTS can transmit the Message Channel MB as the last MB in the PLC Frame. This infers that the message channel MB starts after the energy management MB, if present, or the timestamp MB if the energy management MB is not present. The message channel MB continues to the end of the frame. The MMM messages are segmented across successive message blocks. If the CMTS has no messages to send in the MC, the CMTS can fill the MC MB with the specified idle pattern. Packets can be sent back to back without an idle pattern in between them.

Figure 27:
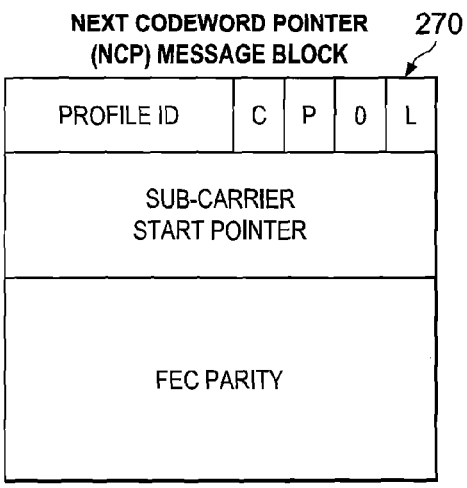
FIG. 27 illustrates an example formatting associated with a next codeword pointer message block in accordance with one embodiment of the present disclosure.

FIG. 27 illustrates an example formatting 270 associated with a next codeword pointer message block in accordance with one embodiment of the present disclosure. NCP MB points to the start of a codeword with a particular profile within the same symbol. There is at least one NCP per symbol in a particular embodiment of the present disclosure. Fields can remain valid if there is no start pointer in accordance with one embodiment.

Figure 28:
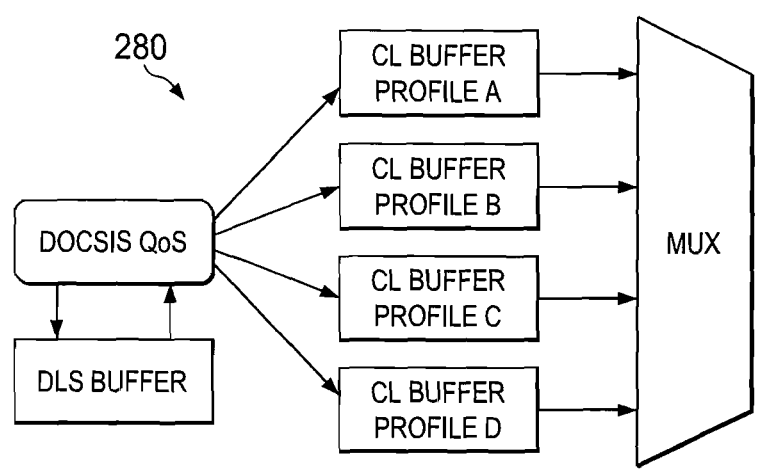
FIG. 28 illustrates an example configuration associated with a Light Sleep Group Mode in accordance with one embodiment of the present disclosure.

FIG. 28 illustrates an example configuration 280 associated with DOCSIS Light Sleep (DLS) Group Mode in accordance with one embodiment of the present disclosure. CMs with low traffic can be moved into a DLS Group. There is one DLS group per profile in a particular example embodiment. CMTS stores packets for a group, while CMs are in EM mode. CMTS wakes up the DLS group and sends the held packets. A CM can sleep for any configurable time interval (e.g., about 200 ms). CMs respond to traffic if necessary and idle CMs can return to the EM mode.

Figure 29:
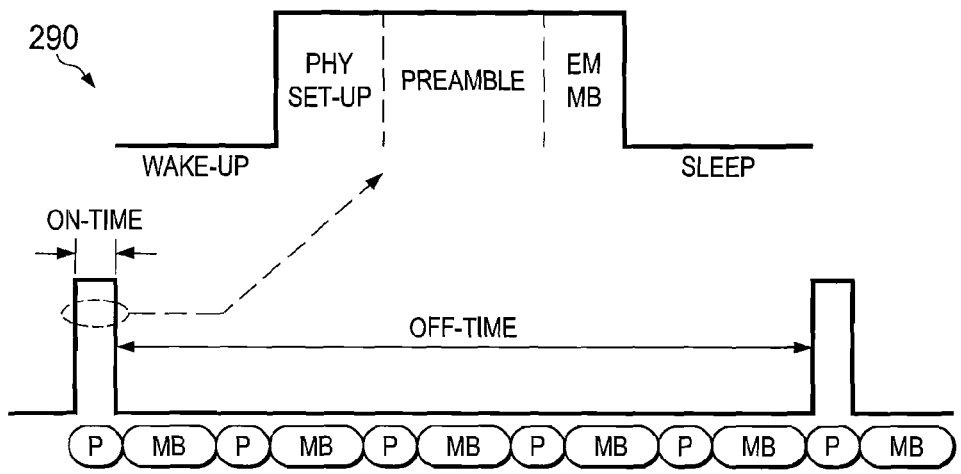
FIG. 29 illustrates an example formatting associated with an energy management (EM) duty cycle approach in accordance with one embodiment of the present disclosure.

FIG. 29 illustrates an example formatting 290 associated with an energy management (EM) duty cycle approach for PLC in accordance with one embodiment of the present disclosure. A duty cycle can be applied to the PLC. The EM has its own FEC so the rest of the larger codeword does not have to be received. The EM can include a sleep-timer message. The PLC frame time is constant and periodic in accordance with one embodiment of the present disclosure.

Figure 30:
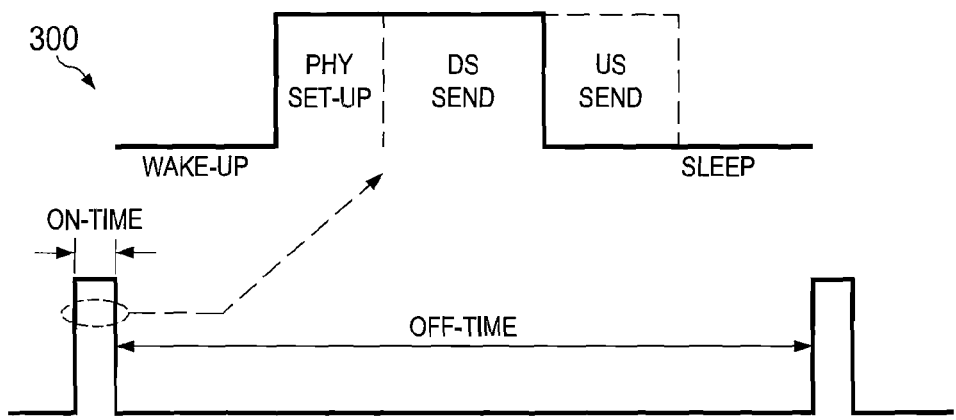
FIG. 30 illustrates an example formatting associated with a duty cycle approach for data channel in accordance with one embodiment of the present disclosure.

FIG. 30 illustrates an example formatting 300 associated with a duty cycle approach for the data channel in accordance with one embodiment of the present disclosure. The CMTS can "duty-cycle" CMs in any appropriate manner. For example: 4 ms on, 196 ms off (2% duty cycle). This can deliver low traffic in bursts. CMs with traffic below a certain threshold can be placed in the DLS. CM hardware or software can be designed to reduce power. In one example embodiment, for the EM States, EM State 0—CM is completely asleep, EM State 1—CM looks at EM block in PLC channel, EM State 2—CM move to data channel and checks for DS data but is still in DLS, EM State 3—CM decides to remain on data channel and exits DLS.

For the PLC message channel, the OFDM Channel Descriptor (OCD) can include static variables that require a reboot to change, cyclic prefix, roll-off, subcarrier 0 freq, interleaver depth, a list/range/vector for excluded SC, pilots, PLC location. For the Downstream Profile Descriptor (DPD), this can include dynamic variables that change on the fly, a profile DPD and NCP DPD, and a list/range/vector for bit loading. An OFDM Channel Descriptor can allow the CMTS to communicate the parameters of the downstream OFDM channel to cable modems. OCD describes the downstream direction. OCD can be used for parameters that are common for all profiles and are static assignments.

Figure 31:
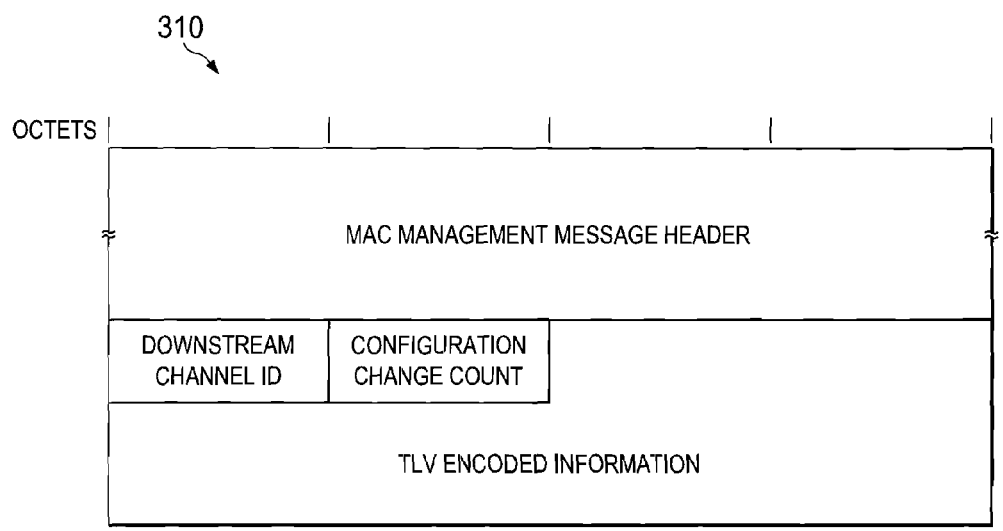
FIG. 31 illustrates an example formatting associated with an OFDM channel descriptor in accordance with one embodiment of the present disclosure.

FIG. 31 illustrates an example formatting 310 associated with an OFDM channel descriptor in accordance with one embodiment of the present disclosure. A CMTS can generate the OCD message in a format, including parameters, as identified below. First, a Downstream Channel ID: an identifier of the downstream channel for which profile is described. This can be an 8-bit field and this ID is part of the same number space used for SC-QAM channels. The CMTS can transmit the OCD message on the PLC associated with the downstream channel. The CMTS should not transmit the OCD message on other PLC channels. The CMTS may transmit the OCD message from one OFDM channel on the data channels of other OFDM channels. The CM can tell the downstream channel ID of an OFDM channel by looking at the downstream channel ID of the OCD message on the PLC channel.

Second, a Configuration Change Count: a parameter that identifies the generation of current generation of a OFDM channel descriptor. The CMTS increments this field by 1 (modulo the field size) whenever any of the values in this message change relative to the values in the previous OCD message sent on this downstream channel. The Configuration Change Count may be referenced in other messages. Again, this is an 8-bit field. The CMTS should not change any parameters in the OCD message while the channel is in service. The CMTS can observe the OCD/DPD PLC interval for the transmission of OCD messages on the PLC channel. The CMTS can observe the OCD/DPD Profile A interval for the transmission of OCD messages on the Profile A of the OFDM channel. The role of subcarrier assignment is shared between the OCD and DPD message. The sub-carrier assignment TLV for OCD can define exclusion of subcarriers, location of the PLC, and continuous pilots. The DPD allows the CMTS to communicate the parameters of downstream profiles to the cable modems. There is one DPD message per profile. DPD is used for parameters that could be unique to a profile and are dynamic assignments.

Figure 32:
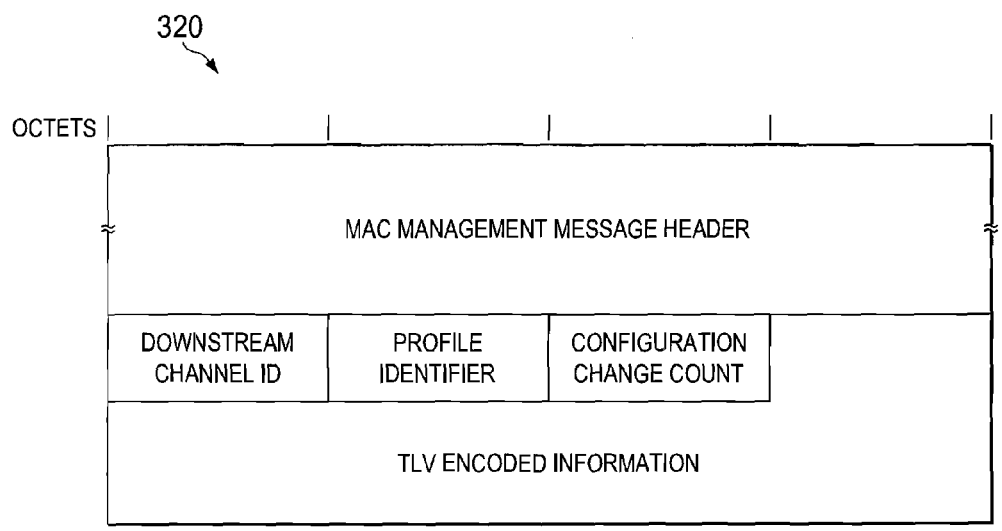
FIG. 32 illustrates an example formatting associated with a downstream profile descriptor in accordance with one embodiment of the present disclosure.

FIG. 32 illustrates an example formatting 320 associated with a downstream profile descriptor in accordance with one embodiment of the present disclosure. A CMTS can generate the DPD message, including the following parameters. First, the Downstream Channel ID: an identifier of the downstream channel for which profile is described. This is an 8-bit field and this ID is part of the same number space used for SC-QAM channels. Second, the Profile Identifier: a parameter that identifies the profile described by this message. Profile Identifiers 0 through 15 are used for the maximum 16 CMTS profiles. Profile Identifier 0 is commonly referred to as Profile A. Profile Identifiers 1, 2, and 3 are commonly referred to as Profiles B, C, and D. Profiles Identifier 16 through 254 can be reserved. Profile Identifier 255 is the NCP profile.

Third, the Configuration Change Count: a parameter that identifies the current generation of a profile. The CMTS increments this field by 1 (modulo the field size) whenever any of the values in this message change relative to the values in the previous DPD message sent on this downstream channel. Configuration Change Count may be referenced in other messages. The least significant bit of the Configuration Change Count is carried in the NCP (even/odd bit). This is also an 8-bit field in accordance with one embodiment of the present disclosure.

The CMTS can publish a next-active profile at least the value "Profile Advance Time" before the odd/even bit for either the data profile update or the NCP profile update is toggled in the NCP message block header. Other parameters of the DPD message are coded as TLV tuples. On profile A of each OFDM channel, the CMTS can periodically transmit DPD messages for each profile of that channel. The CMTS can transmit DPD messages describing profile A of an OFDM Channel on the PLC associated with that OFDM channel.

The CMTS can observe the OCD/DPD PLC interval for the transmission of DPD messages on the PLC channel. The CMTS can observe the OCD/DPD Profile A Interval for the transmission of DPD messages on Profile A of OFDM channel. DPD can be used for dynamic assignments of subcarriers. The subcarrier assignment TLV for OCD can define (for both data fields and NCP fields) unused subcarriers (Muting) and modulation (Active).

DPD can also be used to specify an NCP profile. The NCP profile indicates what modulation each subcarrier should use if it gets selected to carry bits from the NCP message block. If the subcarrier should not be used for NCP, it is marked as muted. The CMTS can use QPSK, 16-QAM or 64-QAM for the NCP field. The CMTS can use the same modulation for all subcarriers in the NCP field. Alternatively, the CMTS may use different modulations for each subcarrier within the NCP profile. To allow for a common implementation, the subcarrier assignment TLV for OCD and DPD can use a common number space for the TLV type and value assignments.

In summary, CMs in sleep mode can look at the control channel on a periodic basis to look for sleep timer messages. There can be a 10% duty cycle applied to the PLC channel and a 5% duty cycle applied to the data channel (e.g., 10 ms on, 50 to 200 ms off). When there is a wake-up message, the CM then loops for NPP pointers in the data channel. CM implementations have a choice of building an optimized narrowband tuner or reusing the wideband tuner.

For the CM boot procedure, the CM can find a convergence layer control channel (CLCC) by searching a known set of frequencies. The CM uses the CLCC preamble to determine RF parameters and to decode the CLCC. The CLCC can include configuration information for the OFDM channel(s) including the boot profile. The CM connects to the boot slice (with profile A by convention). The CM can then be promoted to a working profile, while continuing to listen to profile A for MMM.

FIG. 33 is a table 330 illustrating potential results and profiles associated with multicast traffic in accordance with one embodiment of the present disclosure. Multicast sessions are provided on a profile common to the multicast group in accordance with one embodiment of the present disclosure. This can depend on how many active profiles a CM can support. If channel bandwidth is high and multicast usage is low, this is less relevant. If channel bandwidth is low and multicast usage is high, this issue can become relevant.

For the DOCSIS Time Protocol (DTP), one objective would be to provide native support of IEEE1588 and other external timing protocols. The applications can include small cell backhaul (e.g., pico, femto, and macrocells over DOCSIS) and any other service needing timing. The system can provide precise frequency and time to an external system that is connected to the network port of a DOCSIS CM. Running timing protocols over the top of DOCSIS adds a timing error due to upstream scheduling jitter and asymmetrical delay. DTP allows conversion to and from other timing protocols in accordance with one example embodiment.

FIG. 34 is a simplified block diagram illustrating one potential timing configuration 340 associated with the CMTS and the CM in accordance with one embodiment of the present disclosure. The CMTS can synchronize DOCSIS to a network source (e.g., DTI, IEEE-1588v2, etc.). DTP manages DOCSIS latency and asymmetry. The CM generates precision timing using DOCSIS timing. Accuracy is dependent upon accurate modeling of the CMTS, the CM, and the HFC plant. The system can target accuracy of better than a few μseconds in certain embodiments of the present disclosure.

For using multiple profiles, in practical terms, if the HFC plant cannot be uniformly upgraded, then having multiple downstream slices can ease CM and HFC plant management, as well as provide more overall throughput. In at least one general sense, it is easier to downgrade than upgrade. Downgrading a profile is safer, as it can make CMs operational.

Upgrading a profile is risky as it can cause CMs to fail. A single channel profile would likely degrade over time. The decision to sort is easier than the decision to deny or degrade. With a multi-slice system, less fortunate CMs can be moved to a lower throughput channel without disturbing the rest of the CMs. With a single-slice system, less fortunate CMs may be denied D3.1 service. This can create service issues.

There is somewhat of an OFDM paradox in that a single-slice system works by providing the worst service to all CMs. When one CM has a channel problem, the impact of that problem is directly felt by all other CMs. A multi-slice system works by providing the best overall service to all CMs. When one CM has a problem, it does not directly impact the remaining CMs.

Returning to the architecture of FIG. 1, a brief discussion is provided about some of the possible infrastructure that may be included in communication system 10. In one particular instance, communication system 10 can be associated with a service provider digital subscriber line (DSL) deployment. In other examples, communication system 10 would be equally applicable to other communication environments, such as a simple wide area network (WAN) deployment, cable scenarios, broadband generally, fixed wireless instances, and fiber to the x (FTTx), which is a generic term for any broadband network architecture that uses optical fiber in last-mile architectures. Communication system 10 may include a configuration capable of transmission control protocol/internet protocol (TCP/IP) communications for the transmission and/or reception of packets in a network. Communication system 10 may also operate in conjunction with a user datagram protocol/IP (UDP/IP) or any other suitable protocol, where appropriate and based on particular needs.

The networks discussed herein represent a series of points or nodes of interconnected communication paths for receiving and transmitting packets of information that propagate through communication system 10. The network offers a communicative interface between sources and/or hosts, and may be any LAN, wireless local area network (WLAN), metropolitan area network (MAN), Intranet, Extranet, WAN, virtual private network (VPN), or any other appropriate architecture or system that facilitates communications in a network environment using network elements.

CPEs 15a-15d can be associated with clients, customers, or end users wishing to initiate a communication in communication system 10 via some network. The term 'CPE' is inclusive of devices used to initiate a communication such as a receiver, a computer, a set-top box, a smart television, an Internet radio device (IRD), a cell phone, a telephone, a router, a switch, a residential gateway (RG), a fixed mobile convergence product, a home networking adaptor, an internet access gateway, a smartphone (e.g., a Google Droid™, an iPhone™), a tablet (e.g., an iPad™), a personal digital assistant (PDA), or any other device, component, element, or object capable of initiating voice, audio, video, media, or data exchanges within communication system 10. CPEs 15a-15d may also be inclusive of a suitable interface to the human user, such as a display, a keyboard, a touchpad, a remote control, or other terminal equipment. CPEs 15a-15d may also be any device that seeks to initiate a communication on behalf of another entity or element, such as a program, a database, or any other component, device, element, or object capable of initiating an exchange within communication system 10. In addition, CPEs 15a-15d may be any devices that a service provider may deploy within the service provider's own network premises. Data, as used herein in this document, refers to any type of numeric, voice, video, media, or script data, or any type of source or object code, or any other suitable information in any appropriate format that may be communicated from one point to another.

CMTS 16 and CMs 20a-20b are network elements (apparatuses) that can facilitate the network communication activities discussed herein. As used herein in this Specification, the term 'network element' is meant to encompass routers, switches, cable boxes, gateways, bridges, loadbalancers, cable CMTS routers, DSLAMs, cellular access concentrators, WiMAX access concentrators, firewalls, inline service nodes, proxies, servers, processors, modules, or any other suitable device, component, element, proprietary appliance, or object operable to exchange information in a network environment. These network elements may include any suitable hardware, software, components, modules, interfaces, or objects that facilitate the operations thereof. This may be inclusive of appropriate algorithms, communication protocols, and interfaces that allow for the effective exchange of data or information.

In one implementation, CMTS 16 and/or CMs 20a-20b include software to achieve (or to foster) the network communication activities discussed herein. This could include, for example, the implementation of instances of a sleep mode module, a message block module, and a profile management module as shown in FIG. 3, where these modules interact, perform reciprocating functions, and/or suitably coordinate their activities with peer CMTSs across the network. Additionally, each of these elements can have an internal structure (e.g., a processor, a memory element, etc.) to facilitate any of the operations described herein. In other embodiments, these network communication activities may be executed externally to these elements, or included in some other network element to achieve the intended functionality. Alternatively, CMTS 16 and/or CMs 20a-20b may include software (or reciprocating software) that can coordinate with other network elements in order to achieve the network communication activities described herein. In still other embodiments, one or several devices (e.g., servers) may include any suitable algorithms, hardware, software, components, modules, interfaces, or objects that facilitate the operations discussed herein with respect to energy management, message block generation, and profile management activities.

Note that in certain example implementations, the functions outlined herein may be implemented in logic encoded in one or more non-transitory media (e.g., embedded logic provided in an application specific integrated circuit [ASIC], digital signal processor [DSP] instructions, software [potentially inclusive of object code and source code] to be executed by a processor, or other similar machine, etc.). In some of these instances, a memory [as shown in FIG. 3] can store data used for the operations described herein. This includes the memory being able to store instructions (e.g., software, logic, processor instructions, etc.) that can be executed to carry out the activities described in this Specification. A processor can execute any type of instructions associated with the data to achieve the operations detailed herein in this Specification. In one example, the processor [as shown in FIG. 3] could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array [FPGA], an erasable programmable read only memory (EPROM), an electrically erasable programmable ROM (EE- PROM)) or an ASIC that includes digital logic, software, code, electronic instructions, or any suitable combination thereof.

Furthermore, any of the memory items discussed herein (e.g., memory element 52, buffers, databases, tables, trees, etc.) should be construed as being encompassed within the broad term 'memory element.' Similarly, any of the potential processing elements, modules, and machines described in this Specification should be construed as being encompassed within the broad term 'processor.' Each of the network elements can also include suitable interfaces for receiving, transmitting, and/or otherwise communicating data or information in a network environment.

Note that with the example provided above, as well as numerous other examples provided herein, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that communication system 10 (and its teachings) are readily scalable and can accommodate a large number of components, as well as more complicated/sophisticated arrangements and configurations. Accordingly, the examples provided should not limit the scope or inhibit the broad teachings of communication system 10 as potentially applied to a myriad of other architectures.

It is also important to note that the steps in the preceding flow diagrams illustrate only some of the possible signaling scenarios and patterns that may be executed by, or within, communication system 10. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by communication system 10 in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. For example, although the present disclosure has been described with reference to particular communication exchanges involving certain endpoint components and certain protocols (e.g., involving various DOCSIS Specifications), communication system 10 may be applicable to other protocols and arrangements, and any version of the DOCSIS Specification. Additionally, communication system 10 may operate with other access concentrator systems that use different Layer 2 subscriber identifiers. Moreover, the present disclosure is equally applicable to various technologies, aside from DSL and/or cable architectures, as these have only been offered for purposes of discussion.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A method, comprising:
   creating a plurality of profiles that describe one or more downstream modulations for each data-subcarrier in a channel to be used by a plurality of cable modems, wherein each of the profiles includes a list of modulation orders for one or more subcarriers within an orthogonal frequency-division multiplexing (OFDM) channel, wherein the plurality of profiles are associated with the OFDM channel for a downstream path between a cable modem termination system (CMTS) and the plurality of cable modems;
   receiving at least one testing measurement from the plurality of cable modems; and
   assigning a selected one of the plurality of profiles to each of the plurality of cable modems based, at least in part, on the one testing measurement that was received.

2. The method of claim 1, further comprising:
   executing an algorithm in order to sort the plurality of cable modems into a set of groups based on signal-to-noise ratio measurements received from each of the plurality of cable modems.

3. The method of claim 1, wherein the plurality of profiles are managed by a cable modem termination system (CMTS).

4. The method of claim 3, further comprising:
   adjusting at least a portion of an orthogonal frequency-division multiplexing (OFDM) spectrum in a downstream path between the CMTS and the plurality of cable modems.

5. The method of claim 1, wherein packets to be propagated to the plurality of cable modems are placed into Forward Error Correction (FEC) codewords that have an associated one of the profiles.

6. The method of claim 1, wherein a CMTS is configured to assign a particular PHY Link Channel (PLC) to each OFDM channel in a downstream path between the CMTS and the plurality of cable modems.

7. The method of claim 1, wherein each of the plurality of cable modems belong to multiple groups such that multiple transmission paths exist for each of the plurality of cable modems.

8. The method of claim 1, wherein a CMTS defines the plurality of profiles for use in an OFDM channel for a downstream path between the CMTS and the plurality of cable modems.

9. The method of claim 8, wherein each OFDM channel in a downstream path between the CMTS and the plurality of cable modems has its own unique set of profiles.

10. The method of claim 1, wherein parameters that describe an OFDM downstream channel and each profile on that OFDM downstream channel are defined in OFDM Channel Descriptor (OCD) and Downstream Profile Descriptor (DPD) messages.

11. The method of claim 10, wherein a CMTS transmits the OCD message on the PLC.

12. The method of claim 1, wherein a number of profiles supported by a CMTS is based, at least in part, on a latency characteristic and an available bandwidth for a particular OFDM channel.

13. The method of claim 1, wherein at least one of the profiles is a common profile used by a majority of the plurality of the cable modems that can receive and decode data.

14. The method of claim 1, wherein at least one of the profiles is used for communicating multicast MAC Management Message (MMMs).

15. The method of claim 1, wherein a DPD is used by a CMTS to communicate parameters of the profiles to the plurality of cable modems.

16. The method of claim 1, wherein multicast sessions are propagated on a particular profile that is common to a multicast group associated with particular cable modems.

17. The method of claim 1, wherein a CMTS can indicate to a particular one of the plurality of cable modems to test a particular profile.

18. The method of claim 17, wherein results of the test for the particular one of the cable modems is subsequently reported back to the CMTS such that the CMTS adds the particular profile to the particular one of the plurality of cable modems.

19. Logic encoded in one or more non-transitory media that includes instructions for execution and when executed by a processor is operable to perform operations, comprising:

creating a plurality of profiles that describe one or more downstream modulations for each data-subcarrier in a channel to be used by a plurality of cable modems, wherein each of the profiles includes a list of modulation orders for one or more subcarriers within an orthogonal frequency-division multiplexing (OFDM) channel, wherein the plurality of profiles are associated with the OFDM channel for a downstream path between a cable modem termination system (CMTS) and the plurality of cable modems;

receiving at least one testing measurement from the plurality of cable modems; and assigning a selected one of the plurality of profiles to each of the plurality of cable modems based, at least in part, on the one testing measurement that was received.

20. An apparatus, comprising:

a memory element configured to store instructions;

a processor coupled to the memory; and a profile management module, wherein the profile management module is configured for:

segmenting a plurality of cable modems into a plurality of groups, wherein each of the plurality of cable modems belongs to multiple groups such that multiple transmission paths exist for each of the plurality of cable modems, wherein different profiles are associated with different groups, wherein each of the profiles includes a list of modulation orders for one or more subcarriers within an orthogonal frequency-division multiplexing (OFDM) channel, wherein the profiles are associated with the OFDM channel for a downstream path between a cable modem termination system (CMTS) and the plurality of cable modems;

identifying traffic being received or transmitted by each of the plurality of cable modems that is below a threshold; and determining whether to move each of the plurality of cable modems into a low-power mode based, at least in part, on the traffic being received or transmitted by each of the plurality of cable modems.

* * * * *